United States Patent
Benson, Jr. et al.

(10) Patent No.: US 9,523,919 B2
(45) Date of Patent: Dec. 20, 2016

(54) METHODS FOR MAKING DIFFERENTIALLY PATTERN CURED MICROSTRUCTURED ARTICLES

(75) Inventors: Olester Benson, Jr., Woodbury, MN (US); Kathryn M. Spurgeon, River Falls, WI (US); Steven R. Vanhoose, Stillwater, MN (US); Tadesse G. Nigatu, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 456 days.

(21) Appl. No.: 14/117,230

(22) PCT Filed: May 23, 2012

(86) PCT No.: PCT/US2012/039092
§ 371 (c)(1),
(2), (4) Date: Nov. 12, 2013

(87) PCT Pub. No.: WO2012/166460
PCT Pub. Date: Dec. 6, 2012

(65) Prior Publication Data
US 2015/0079521 A1    Mar. 19, 2015

Related U.S. Application Data

(60) Provisional application No. 61/491,616, filed on May 31, 2011.

(51) Int. Cl.
| | | |
|---|---|---|
| G03F 7/20 | (2006.01) | |
| B29C 35/08 | (2006.01) | |
| B29C 35/10 | (2006.01) | |
| B29C 59/04 | (2006.01) | |
| B29C 37/00 | (2006.01) | |

(52) U.S. Cl.
CPC .......... *G03F 7/2022* (2013.01); *B29C 35/0888* (2013.01); *B29C 35/0894* (2013.01);
(Continued)

(58) Field of Classification Search
CPC .. B29C 35/0888; B29C 35/0894; B29C 35/10; B29C 59/046; G03F 7/203
See application file for complete search history.

(56) References Cited

U.S. PATENT DOCUMENTS

| 3,357,772 A | 12/1967 | Rowland |
| 3,357,773 A | 12/1967 | Rowland |

(Continued)

FOREIGN PATENT DOCUMENTS

| EP | 1 259 851 | 11/2002 |
| EP | 1 762 893 | 3/2007 |
| JP | 2004-506547 | 3/2004 |
| JP | 2006-095836 | 4/2006 |
| JP | 2008-168641 | 7/2008 |
| JP | 2009/294405 | 12/2009 |

(Continued)

OTHER PUBLICATIONS

Light-emitting diode—from Wikipedia, the free encyclopedia, [on line], [retrieved from internet on Nov. 8, 2013], URL:< http://en.wikipedia.org/wiki/Light-emitting_diode>, 36 pages.

(Continued)

*Primary Examiner* — Stella Yi
(74) *Attorney, Agent, or Firm* — Qiang Han

(57) ABSTRACT

Methods for making differentially pattern cured microstructured articles are disclosed, using a molding tool having a microstructured surface, a patterned irradiation to generate irradiate and non-irradiated regions in a radiation curable resin. Different combinations of molding tools and patterned irradiation provide numerous variants of differentially pattern cured microstructured articles without requiring costly modification of the molding tools.

20 Claims, 25 Drawing Sheets

(52) U.S. Cl.
CPC ............ *B29C 35/10* (2013.01); *B29C 59/046*
(2013.01); *G03F 7/203* (2013.01); *B29C 37/0053* (2013.01); *B29C 2035/0827* (2013.01); *B29C 2035/0838* (2013.01); *B29C 2035/0877* (2013.01)

(56) References Cited

U.S. PATENT DOCUMENTS

| | | | |
|---|---|---|---|
| 3,449,158 A | 6/1969 | Rowland |
| 3,469,898 A | 9/1969 | Altman |
| 3,496,044 A | 2/1970 | Rowland |
| 3,632,695 A | 1/1972 | Howell |
| 3,658,528 A | 4/1972 | Berman |
| 3,684,348 A | 8/1972 | Rowland |
| 3,689,346 A | 9/1972 | Rowland |
| 3,745,586 A | 7/1973 | Braudy |
| 3,811,983 A | 5/1974 | Rowland |
| 3,935,359 A | 1/1976 | Rowland |
| 4,289,821 A | 9/1981 | Gray, III |
| 4,322,450 A | 3/1982 | Gray, III |
| 4,332,847 A | 6/1982 | Rowland |
| 4,514,345 A | 4/1985 | Johnson |
| 4,576,850 A | 3/1986 | Martens |
| 4,588,258 A | 5/1986 | Hoopman |
| 4,601,861 A | 7/1986 | Pricone |
| 4,634,220 A | 1/1987 | Hockert |
| 4,668,558 A | 5/1987 | Barber |
| 4,703,999 A | 11/1987 | Benson |
| 4,758,296 A | 7/1988 | McGrew |
| 4,775,219 A | 10/1988 | Appeldorn |
| 4,801,193 A | 1/1989 | Martin |
| 4,877,717 A | 10/1989 | Suzuki |
| 4,895,428 A | 1/1990 | Nelson |
| 4,938,563 A | 7/1990 | Nelson |
| 4,942,112 A | 7/1990 | Monroe |
| 5,138,488 A | 8/1992 | Szczech |
| 5,175,030 A | 12/1992 | Lu |
| 5,183,597 A | 2/1993 | Lu |
| 5,330,799 A | 7/1994 | Sandor |
| 5,425,848 A | 6/1995 | Haisma |
| 5,435,816 A | 7/1995 | Spurgeon |
| 5,450,235 A | 9/1995 | Smith |
| 5,491,586 A | 2/1996 | Phillips |
| 5,600,484 A | 2/1997 | Benson |
| 5,642,222 A | 6/1997 | Phillips |
| 5,643,400 A | 7/1997 | Bernard |
| 5,656,360 A | 8/1997 | Faykish |
| 5,691,846 A | 11/1997 | Benson, Jr. |
| 5,696,627 A | 12/1997 | Benson |
| 5,706,132 A | 1/1998 | Nestegard |
| 5,759,468 A | 6/1998 | Smith |
| 5,763,049 A | 6/1998 | Frey |
| 5,770,124 A | 6/1998 | Marecki |
| 5,777,790 A | 7/1998 | Nakajima |
| 5,780,140 A | 7/1998 | Nilsen |
| 5,784,197 A | 7/1998 | Frey |
| 5,876,805 A | 3/1999 | Ostlie |
| 5,940,212 A | 8/1999 | Johnson |
| 5,948,588 A | 9/1999 | Sawyer |
| 6,024,455 A | 2/2000 | O'Neill |
| 6,119,751 A | 9/2000 | Nilsen |
| 6,120,636 A | 9/2000 | Nilsen |
| 6,172,810 B1 | 1/2001 | Fleming |
| 6,200,399 B1 | 3/2001 | Thielman |
| 6,257,860 B1 | 7/2001 | Luttrell |
| 6,288,842 B1 | 9/2001 | Florczak |
| 6,318,867 B1 | 11/2001 | Bacon, Jr. |
| 6,636,363 B2 | 10/2003 | Kaminsky |
| 6,663,246 B2 | 12/2003 | Currens |
| 6,703,108 B1 | 3/2004 | Bacon, Jr. |
| 6,805,957 B1 | 10/2004 | Santos |
| 6,858,253 B2 | 2/2005 | Williams |
| 7,068,434 B2 | 6/2006 | Florczak |
| 7,079,915 B2 | 7/2006 | Huang |
| 7,156,527 B2 | 1/2007 | Smith |
| 7,188,960 B2 | 3/2007 | Smith |
| 7,230,764 B2 | 6/2007 | Mullen |
| 7,250,122 B2 | 7/2007 | Mullen |
| 7,330,315 B2 | 2/2008 | Nilsen |
| 7,401,550 B2 | 7/2008 | Lutz |
| 7,406,239 B2 | 7/2008 | Ouderkirk |
| 7,410,604 B2 | 8/2008 | Erickson |
| 7,442,442 B2 | 10/2008 | Strobel |
| 7,517,205 B2 | 4/2009 | Mullen |
| 7,556,386 B2 | 7/2009 | Smith |
| 7,607,584 B2 | 10/2009 | Kanevsky |
| 7,611,251 B2 | 11/2009 | Thakkar |
| 7,824,516 B2 | 11/2010 | Amos |
| 7,862,187 B2 | 1/2011 | Thakkar |
| 8,027,086 B2 | 9/2011 | Guo |
| 2001/0048169 A1 | 12/2001 | Nilsen |
| 2002/0186472 A1 | 12/2002 | Sloot |
| 2004/0190102 A1 | 9/2004 | Mullen |
| 2005/0141243 A1 | 6/2005 | Mullen |
| 2005/0258637 A1 | 11/2005 | Bi |
| 2006/0001937 A1 | 1/2006 | Drinkwater |
| 2006/0210714 A1 | 9/2006 | Huizinga |
| 2007/0099478 A1 | 5/2007 | Petersen |
| 2007/0209244 A1 | 9/2007 | Prollius |
| 2007/0236939 A1 | 10/2007 | Ouderkirk |
| 2008/0012162 A1 | 1/2008 | Chapman |
| 2008/0085481 A1 | 4/2008 | Merrill |
| 2008/0212181 A1 | 9/2008 | Wu |
| 2008/0248212 A1 | 10/2008 | Muggli |
| 2008/0276817 A1 | 11/2008 | Hinch |
| 2009/0029054 A1 | 1/2009 | Yapel |
| 2009/0122405 A1 | 5/2009 | Mimura |
| 2010/0103521 A1 | 4/2010 | Smith |
| 2010/0219626 A1 | 9/2010 | Dietemann |
| 2010/0226009 A1 | 9/2010 | Smith |
| 2010/0232019 A1 | 9/2010 | Smith |
| 2010/0277801 A1 | 11/2010 | Nakajima |
| 2011/0109012 A1 | 5/2011 | Furutono et al. |

FOREIGN PATENT DOCUMENTS

| | | |
|---|---|---|
| JP | 2011-103362 | 5/2011 |
| WO | WO 96/30786 | 10/1996 |
| WO | WO 99/40462 | 8/1999 |
| WO | WO 01/74560 | 10/2001 |
| WO | WO 02/34855 | 5/2002 |
| WO | WO 03/069741 | 8/2003 |
| WO | WO 2004/078477 A1 | 9/2004 |
| WO | WO 2005/005121 | 1/2005 |
| WO | WO 2005/069085 | 7/2005 |
| WO | WO 2005/119350 | 12/2005 |
| WO | WO 2006/138129 | 12/2006 |
| WO | WO 2007/121284 | 10/2007 |
| WO | WO 2009/006252 | 1/2009 |
| WO | WO 2009/009258 | 1/2009 |
| WO | WO 2009/042118 | 4/2009 |
| WO | WO 2010/048416 | 4/2010 |
| WO | WO 2010/065247 | 6/2010 |
| WO | WO 2011/002617 | 1/2011 |
| WO | WO 2011/031501 | 3/2011 |
| WO | WO 2011/060086 | 5/2011 |
| WO | WO 2012/166447 | 12/2012 |
| WO | WO 2012/166448 | 12/2012 |
| WO | WO 2012/166460 | 12/2012 |
| WO | WO 2012/166462 | 12/2012 |

OTHER PUBLICATIONS

Disclosed Anonymously, "Improvements to Continuous Casting Processes", IP.com No. IPCOM000167282D, IP.com Electronic Publication: Feb. 6, 2008.
*Structured Illumination As a Processing Method for Controlling Photopolymerized Coating Characteristics*, Peter Ganahl, PhD Thesis, University of Iowa, 2007.
Torigoe, et al., Sep. 2004 ICSTS conference proceedings for "Study of Embossing by Casting, Curing and Peeling on a Patterned Roll".

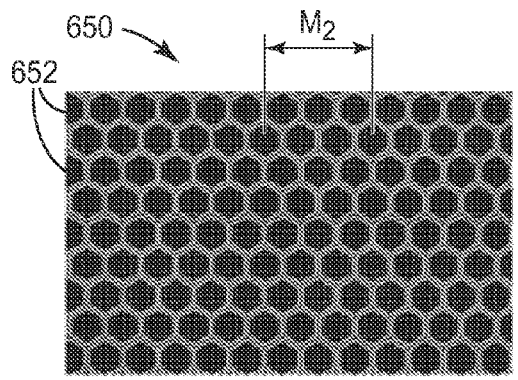 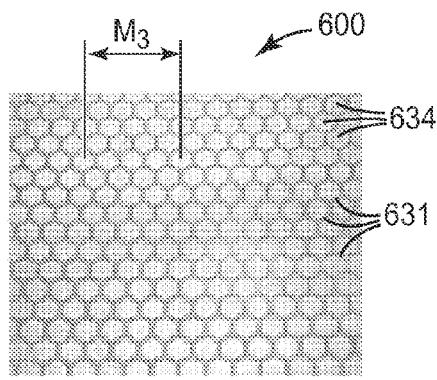
FIG. 6A      FIG. 6B
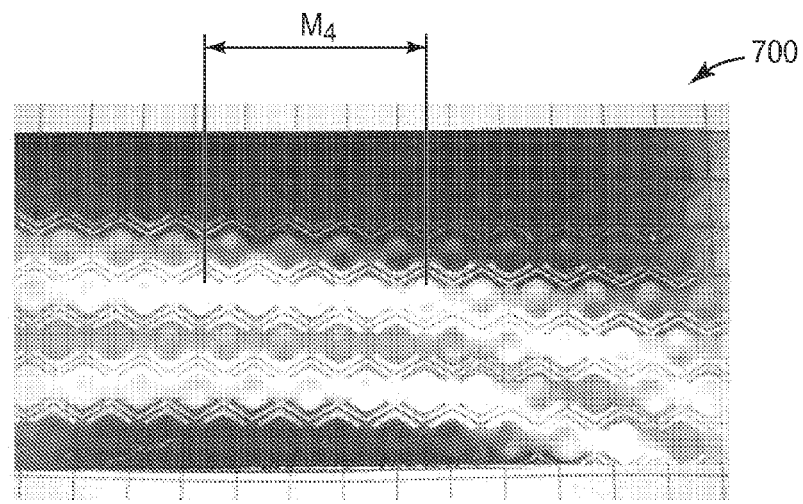
FIG. 7

METHODS FOR MAKING DIFFERENTIALLY PATTERN CURED MICROSTRUCTURED ARTICLES

CROSS REFERENCE TO RELATED APPLICATIONS

This application is a national stage filing under 35 U.S.C. 371 of PCT/US2012/039092 filed May 23, 2012, which claims priority to U.S. Provisional Patent Application No. 61/491,616, filed May 31, 2011, the disclosures of which are incorporated by reference in their entirety herein.

BACKGROUND

Methods for using a patterned tool to replicate a complementary pattern in the surface of a film are well known. However, in many instances the pattern resulting from the replication method may be limited by the tool (e.g., certain pattern configurations do not lend themselves to being replicated by conventional replication methods).

SUMMARY

What is needed is a method, preferably that is relatively rapid and relatively low-cost, for creating a variety of differentially pattern cured microstructured articles without permanent physical modification of a microreplication tool.

In general, the present disclosure describes methods for generating microstructured articles having differentially pattern cured regions that have different properties (e.g., having at least two regions that have differences in their optical, mechanical, or adhesive properties) by using various combinations of molding tools, radiation curable resins, and patterned radiation sources (e.g., masked light-emitting diodes, masked ultraviolet lamps, masked e-beam, lasers, and projected images). By applying a radiation curable resin to a microstructured molding tool in combination with irradiating the radiation curable resin with various patterned and non-patterned irradiation techniques, a wide variety of differentially pattern cured microstructured articles can be produced, without having to provide a different molding tool for each different pattern.

In a first aspect, the present disclosure describes a method of making an article, the method comprising providing a molding tool having a microstructured surface including a plurality of cavities; at least partially filling the plurality of cavities with a first radiation curable resin; exposing the first radiation curable resin to a first, patterned irradiation to provide a correspondingly patterned partially cured resin comprising at least one first region and at least one second region, wherein the at least one first region is irradiated by the first, patterned irradiation and the at least one second region is not irradiated by the first, patterned irradiation; exposing both the at least one first region and the at least one second region to a second irradiation to provide an article having a microstructured surface and a differentially cured pattern therein; and separating the article having a microstructured surface and a differentially cured pattern therein from the molding tool.

In a second aspect, the present disclosure describes a method of making an article, the method comprising providing a first molding tool having a first microstructured surface including a plurality of cavities; at least partially filling the plurality of cavities with a radiation curable resin disposed on a major surface of an overlay element; exposing the radiation curable resin to a first, patterned irradiation to provide a partially cured composite comprising the overlay element adhered to a correspondingly patterned partially cured resin comprising at least one first region and at least one second region, wherein the at least one first region is irradiated by the first, patterned irradiation and the at least one second region is not irradiated by the first, patterned irradiation; separating the partially cured composite from the molding tool, such that at least a portion of curable resin from the at least one second region remains in the molding tool, providing the separated partially cured composite with a surface that lacks microstructure in the at least one second region; and exposing the partially cured composite that was separated from the molding tool to a second irradiation, to provide a composite article having a first microstructured surface and a differentially cured pattern therein.

In some embodiments of the method of the second aspect, the method further comprises providing a second molding tool having a second microstructured surface including a second plurality of cavities; at least partially filling the second plurality of cavities with a second radiation curable resin disposed on a second major surface of the overlay element of the composite article having a first microstructured surface and a differentially cured pattern therein; exposing the second radiation curable resin to a third irradiation, to provide an article having the first microstructured surface and the differentially cured pattern therein on the first major surface and a second microstructured surface on the second major surface; and separating the article from the second molding tool.

In a third aspect, the present disclosure describes a method comprising providing a molding tool having a microstructured surface including a plurality of cavities; at least partially filling the plurality of cavities with a radiation curable resin disposed on a major surface of an overlay element; exposing the radiation curable resin to a patterned irradiation to provide a partially cured composite comprising the overlay element adhered to a correspondingly patterned partially cured resin comprising at least one first region and at least one second region, wherein the at least one first region is irradiated by the patterned irradiation and the at least one second region is not irradiated by the patterned irradiation; separating the partially cured composite from the molding tool; and removing the radiation curable resin from the at least one second region to provide a composite article having a microstructured surface.

These methods are useful for providing a broad array of differentially pattern cured microstructured articles from a given molding tool, without requiring modification of the molding tool.

"Blanket irradiation" refers to a non-patterned irradiation.

"Cured" in reference to polymers refers to polymers made by cross-linking liquid, flowable or formable monomeric or oligomeric precursors by application of an appropriate energy source to produce a solid material by various means including free-radical polymerization, cationic polymerization, and anionic polymerization.

"Cured oligomeric resin" refers to polymeric materials made by curing curable compositions comprising prepolymeric materials having at least two repeating monomeric units which may be mixed with other monomeric materials.

"Differentially pattern cured" refers to the pattern of curing in a radiation curable material upon exposure to a patterned irradiation, wherein different levels of curing occur to form a visible pattern in the radiation curable material.

"Microstructure", used herein in the context of an article having a surface bearing microstructure, refers to the configuration of a surface which depicts or characterizes the predetermined desired utilitarian purpose or function of the article. Discontinuities (e.g., projections and indentations in the surface) will deviate in profile from the average profile or center line drawn through the microstructure such that the sum of the areas embraced by the surface profile above the line is equal to the sum of those areas below the line, the line being essentially parallel to the nominal surface (bearing the microstructure) of the article. The heights of the deviations are ±0.005 micrometer to ±750 micrometers through a representative characteristic length of the surface (e.g., 1 centimeter to 30 centimeters). The average profile, or center line, can be plano, concave, convex, aspheric, or combinations thereof. Articles where the deviations are of low order (e.g., from ±0.005 micrometer to ±0.1 micrometer or, preferably, from ±0.005 micrometer to ±0.05 micrometers) and the deviations are of infrequent or minimal occurrence (i.e., the surface is free of any significant discontinuities), are those where the microstructure-bearing surface is an essentially "flat" or "perfectly smooth" surface, such articles being useful, for example, as precision optical elements or elements with a precision optical interface (e.g., ophthalmic lenses). Articles where the deviations are of the low order and of frequent occurrence are those bearing utilitarian discontinuities, as in the case of articles having anti-reflective microstructure. Articles where the deviations are of high order (e.g., from ±0.1 micrometer to ±750 micrometer) and attributable to microstructure comprising a plurality of utilitarian discontinuities which are the same or different and spaced apart or contiguous in a random or ordered manner, are articles (e.g., retroreflective cube-corner sheeting, linear Fresnel lenses, and video discs). The microstructure-bearing surface can contain utilitarian discontinuities of both the low and high orders. The microstructure-bearing surface may contain extraneous or non-utilitarian discontinuities so long as the amounts or types thereof do not significantly interfere with or adversely affect the predetermined desired utilities of the articles. In some embodiments, microstructural elements include at least one of cones, diffraction gratings, lenticulars, segments of a sphere, pyramids, cylinders, fresnels, or prisms. It may be necessary or desirable to select a particular oligomeric composition whose shrinkage upon curing does not result in the interfering extraneous discontinuities (e.g., a composition which shrinks only 2% to 6%). The profiles and the dimensions and spacing of the discontinuities are those discernible by an electron microscope at 1000× to 100,000×, or an optical microscope at 10× to 1000×.

"Not irradiated" refers to a exposure to a given radiation at a level of 0%, or no more than about 1% (in some embodiments, no more than about 2%, or no more than about 5%, or no more than about 10%) of a level of irradiation to which an irradiated region is exposed, with respect to the given irradiation. In some embodiments, the level of irradiation to which an irradiated region is exposed can be quantified as an energy density in units of Joules/cm$^2$.

"Opaque" refers to a mask that substantially absorbs or reflects a given irradiation (i.e., at least 90% of the given irradiation is absorbed or reflected, typically at least 95% of the given irradiation is absorbed or reflected).

"Overlay element" refers to a layer that becomes part of some embodiments of a differentially pattern cured microstructured articles described herein. In methods described herein that include an overlay element, the overlay element typically contacts a radiation curable material. Typically, the overlay element is a film (i.e., an "overlay film"), although in some embodiments the overlay element may be other than a film (e.g., a glass sheet, a metal sheet, a wooden board, or a stone slab).

"Partially cured" refers to part of a radiation curable resin being cured to such a degree that it will not substantially flow.

"Pattern" refers to a spatially varying appearance. The term "pattern" is at least one of a uniform or periodic pattern, a varying pattern, or a random pattern.

"Patterned irradiation" refers to at least one of irradiating through transparent regions of a mask, guiding a beam of light, guiding a beam of electrons, or projecting a digital image, to produce a patterned partial curing in a radiation curable resin.

"Security mark" refers to an element on or in an article described herein that is surrounded by a background visual appearance. In many embodiments the security mark is an "island" feature surrounded by a continuous background appearance. The security mark can change appearance to a viewer as the viewer changes their point of view of the security mark.

"Visible" refers to being apparent and identifiable (i.e., to ascertain definitive characteristics of) to the unaided human eye of normal (i.e., 20/20) vision, using light from within a wavelength range of about 400 nm to about 700 nm. By "unaided", it is meant without the use of a microscope or magnifying glass.

"Ultraviolet light" refers to electromagnetic radiation whose wavelength is less than about 400 nm, the term "visible light" refers to a wavelength range from about 400 to about 700 nm, and the term "near infrared" refers to a wavelength range from about 700 to about 2500 nm.

Many combinations of molding tools, patterned irradiation techniques, and radiation curable materials are included in the methods described herein. Using these methods, a wide variety of differentially pattern cured microstructured articles can be produced without requiring costly modification of a molding tool.

Exemplary uses of the methods described herein include the production of articles having a product security mark, a logo, a trademark, a decorative appearance, and light management properties (e.g., for transmitted light, reflected light, or retroreflected light).

BRIEF DESCRIPTION OF THE DRAWINGS

FIG. 6A is a digital photographic image of an exemplary mask used herein, and FIG. 6B is a digital photographic image of an exemplary differentially pattern cured microstructured article prepared from the mask in FIG. 6A;

FIG. 7 is a digital photographic image of an exemplary differentially pattern cured microstructured article prepared from the mask in FIG. 6A;

Like reference numbers in the various figures indicate like elements. However, it will be understood that the use of a number to refer to a component in a given figure is not intended to limit the component in another figure labeled with the same number. Some elements may be present in identical or equivalent multiples; in such cases only one or more representative elements may be designated by a reference number but it will be understood that such reference numbers apply to all such identical elements. Unless otherwise indicated, all figures and drawings in this document are not to scale and are chosen for the purpose of illustrating different embodiments of the description. In particular the dimensions of the various components are depicted in illustrative terms only, and no relationship between the dimensions of the various components should be inferred from the drawings, unless so indicated. Although terms such as "top", "bottom", "upper", "lower", "under", "over", "front", "back", "outward", "inward", "up" and "down", and "first" and "second" may be used in this disclosure, it should be understood that those terms are used in their relative sense only unless otherwise noted. In particular, in some embodiments certain components may be present in interchangeable and/or identical multiples (e.g., pairs). For these components, the designation of "first" and "second" may apply to the order of use, as noted herein (with it being irrelevant as to which one of the components is selected to be used first).

DETAILED DESCRIPTION

Figure 1A:
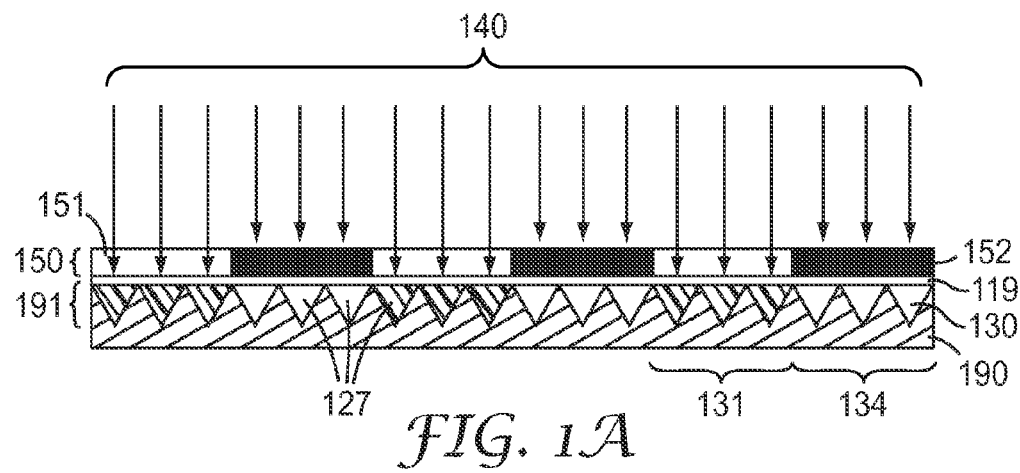
FIGS. 1A to 1F illustrate an exemplary embodiment of a method of the present disclosure for making differentially pattern cured microstructured articles.
Figure 1B:
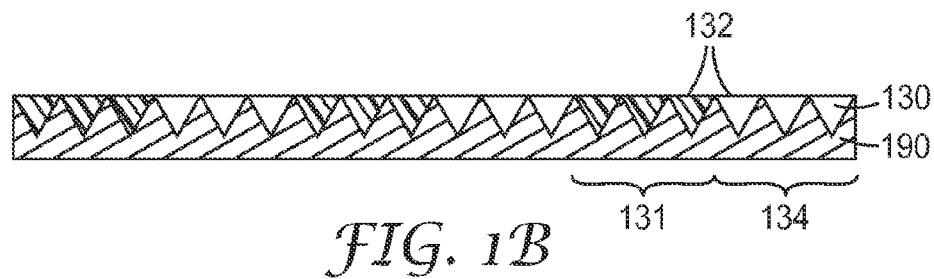
Figure 1C:
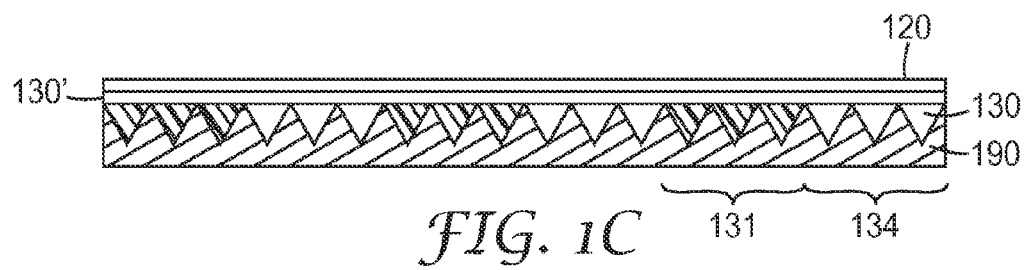
Figure 1D:
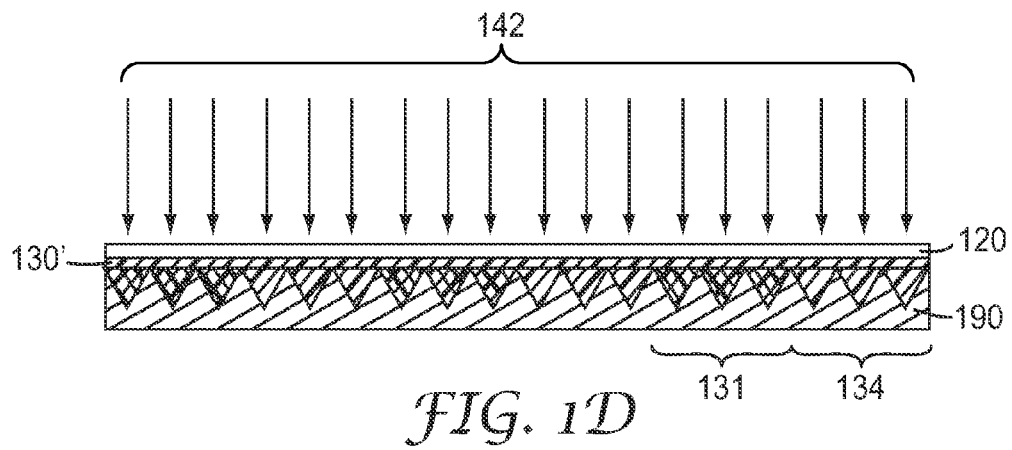
Figure 1E:

FIGS. 1A-1E illustrate an exemplary embodiment of a method for making a differentially pattern cured microstructured article. Molding tool 190 has microstructured surface 191 including plurality of cavities 127. Plurality of cavities 127 is at least partially filled with radiation curable resin 130, and mask 150 is provided over plurality of cavities 127. Optional release liner 119 is shown between mask 150 and radiation curable resin 130, in order to facilitate removal of mask 150 from radiation curable resin 130. Radiation curable resin 130 is exposed to first, patterned irradiation by passing radiation 140 through at least one radiation transparent region 151 in mask 150. At least one first region 131 of radiation curable resin 130 is at least partially cured by first irradiation 140, while at least one radiation non-transparent region 152 in mask 150 blocks first irradiation 140, forming a partially cured resin comprising a pattern of at least one first region 131 and at least one second region 134, as illustrated in FIG. 1A. At least one second region 134 is not cured by first irradiation 140. Mask 150 and release liner 119 are removed, exposing surface 132 of both at least one first region 131 and at least one second region 134, as shown in FIG. 1B. FIG. 1C shows an additional layer of radiation curable resin 130' coated onto both at least one first region 131 and at least one second region 134, and overlay element 120 contacting layer of radiation curable resin 130'. In the exemplary embodiment illustrated in FIGS. 1C to 1E, overlay element 120 is transparent to second irradiation 142. In other exemplary embodiments (not shown), second irradiation 142 passes first through molding tool 190, provided that molding tool 190 is transparent to second irradiation 142, and in such exemplary embodiments overlay element 120 need not be transparent to second irradiation 142. In the exemplary embodiment illustrated in FIG. 1D, at least one first region 131 and at least one second region 134 are both exposed to a second irradiation 142, which first passes through overlay element 120. Additional layer of radiation curable resin 130' is also exposed to second irradiation 142. FIG. 1E shows article 100 separated from molding tool 190 after second irradiation 142, having differentially cured microstructured layer 135.

Figure 1F:
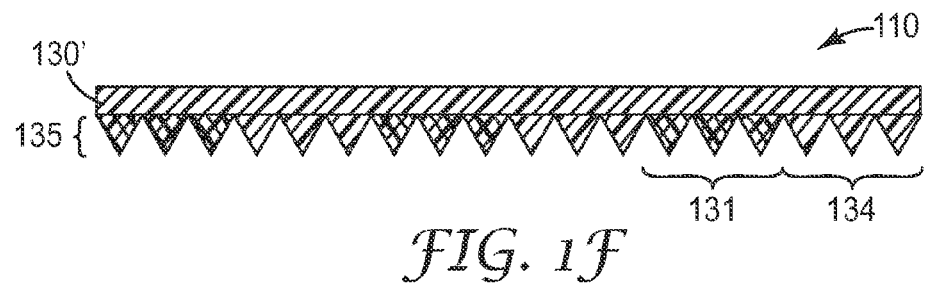

FIG. 1F illustrates an alternate exemplary embodiment of differentially cured microstructured article 110 having differentially cured microstructured layer 135 and layer of radiation curable resin 130' (shown after irradiation). The radiation curable resin used in at least one second region 134 and in layer of radiation curable resin 130' may be selected to be the same or different from each other.

Figure 2:
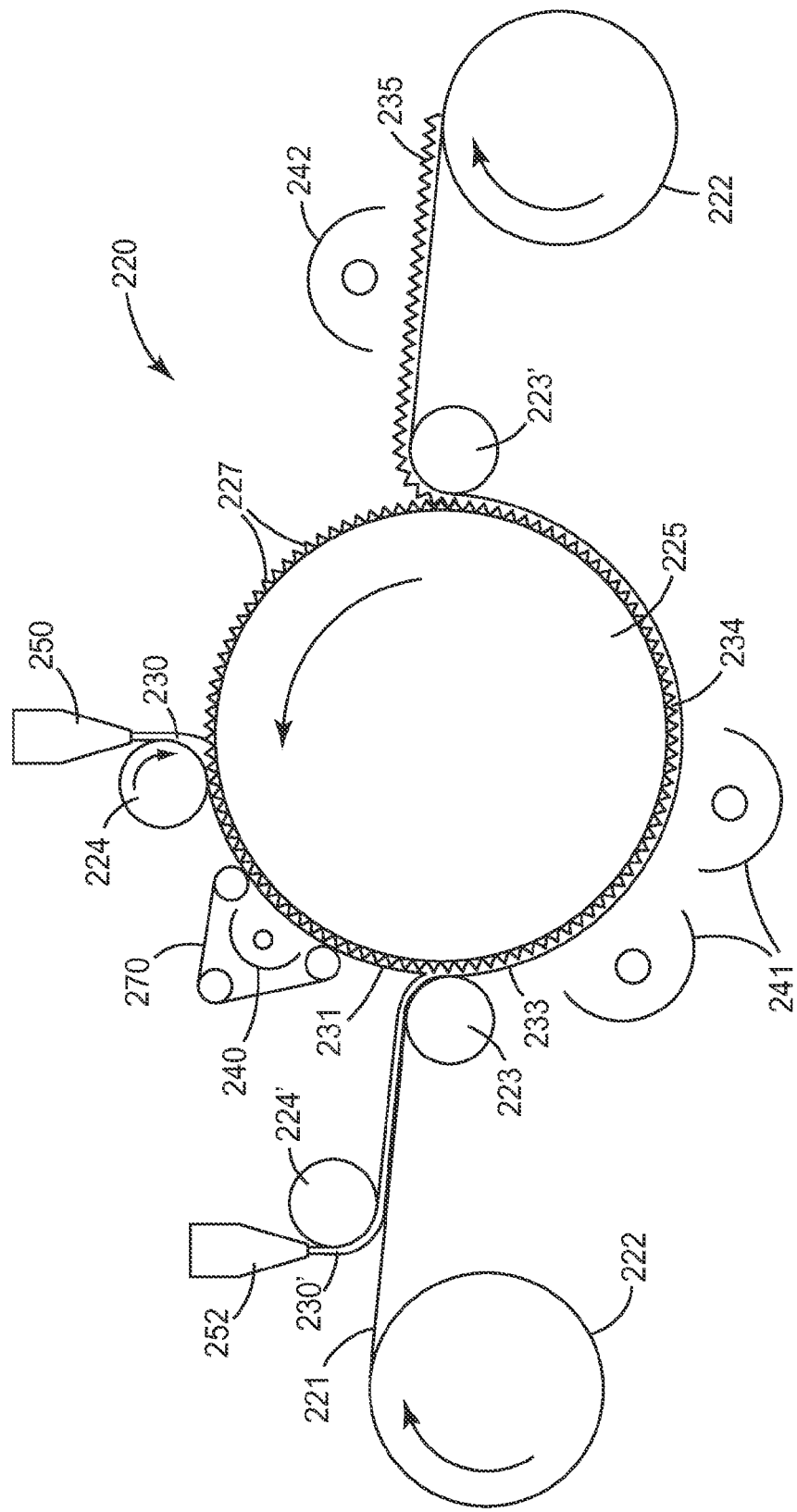
FIG. 2 illustrates an exemplary apparatus for continuous differentially pattern cured microreplication using methods described herein.

FIG. 2 illustrates an exemplary embodiment of a method for continuous differentially pattern cured microreplication, based on the method illustrated for FIGS. 1A-1E. Apparatus 220 includes molding tool roll 225, having a microstructured surface that includes plurality of cavities 227. Plurality of cavities 227 is at least partially filled with radiation curable resin 230, delivered from die 250 via roll 224. As molding tool roll 225 is rotated, radiation curable resin 230 passes under mask 270. Mask 270 has radiation transparent regions (not shown) and radiation non-transparent regions (not shown), analogous to at least one radiation transparent region 151 and at least one radiation non-transparent region 152 of mask 150 in FIG. 1A. Mask 270 is optionally provided with a release liner (not shown) to permit mask 270 to separate from radiation curable resin 230. First irradiation source 240 provides first irradiation of radiation curable resin 230 through radiation transparent regions of mask 270. Radiation non-transparent regions of mask 270 are opaque to irradiation from irradiation source 240, resulting in non-irradiated regions of radiation curable resin 230. Irradiated regions of radiation curable resin 230 are at least partially cured by first irradiation 240, while non-irradiated regions of radiation curable resin 230 are not cured, forming partially cured resin 231 comprising a pattern of irradiated regions and non-irradiated regions, analogous to the pattern of at least one first region 131 and at least one second region 134 illustrated in FIG. 1B.

In the exemplary embodiment illustrated in FIG. 2, radiation curable resin 230' is delivered from die 252 onto a major surface of overlay element 221 from supply roll 222 (optionally including roll 224' in the coating of radiation curable resin 230') which is then is nipped with roll 223 against partially cured resin 231 on the microstructured surface of molding tool roll 225, forming partially cured composite 233 that is subsequently irradiated by second irradiation source 241 to form further cured composite 234. Further cured composite 234 is separated from molding tool roll 225, and passes under third irradiation source 242 to form article 235 having a microstructured surface and a differentially cured pattern therein. Article 235 is shown in FIG. 2 as being taken up on roll 222'.

In some exemplary embodiments of the method illustrated in FIG. 2, radiation curable resins 230 and 230' may be the same as each other. In some other exemplary embodiments, radiation curable resins 230 and 230' may be different from each other.

Overlay element 221 is shown in FIG. 2 as being supplied from a roll. Depending on the flexibility of the overlay element, the overlay element may be supported with suitable carrier layer (not shown) that provides structural and mechanical durability to the overlay element during casting and solidification or curing. The carrier layer may become incorporated into article 235 (i.e., the carrier layer may be secured to overlay element 221), or the carrier layer may be removably associated with overlay element 221 and removed after the second irradiation.

The carrier layer can be any conventional films, papers or foils used for such purpose, including polyester films, cellulose acetate films, polypropylene films, polycarbonate films, printing paper, kraft paper, security paper, packaging paper, aluminum foil, and copper foil. In some embodiments, the carrier layer is selected to be transparent to the first, patterned irradiation. In some other embodiments, the carrier layer is selected to be opaque to the first, patterned irradiation, and in those embodiments, the molding tool is selected to be transparent to the first, patterned irradiation, and radiation curable resin 230 is irradiated by passing irradiation first through the molding tool.

Figure 3:
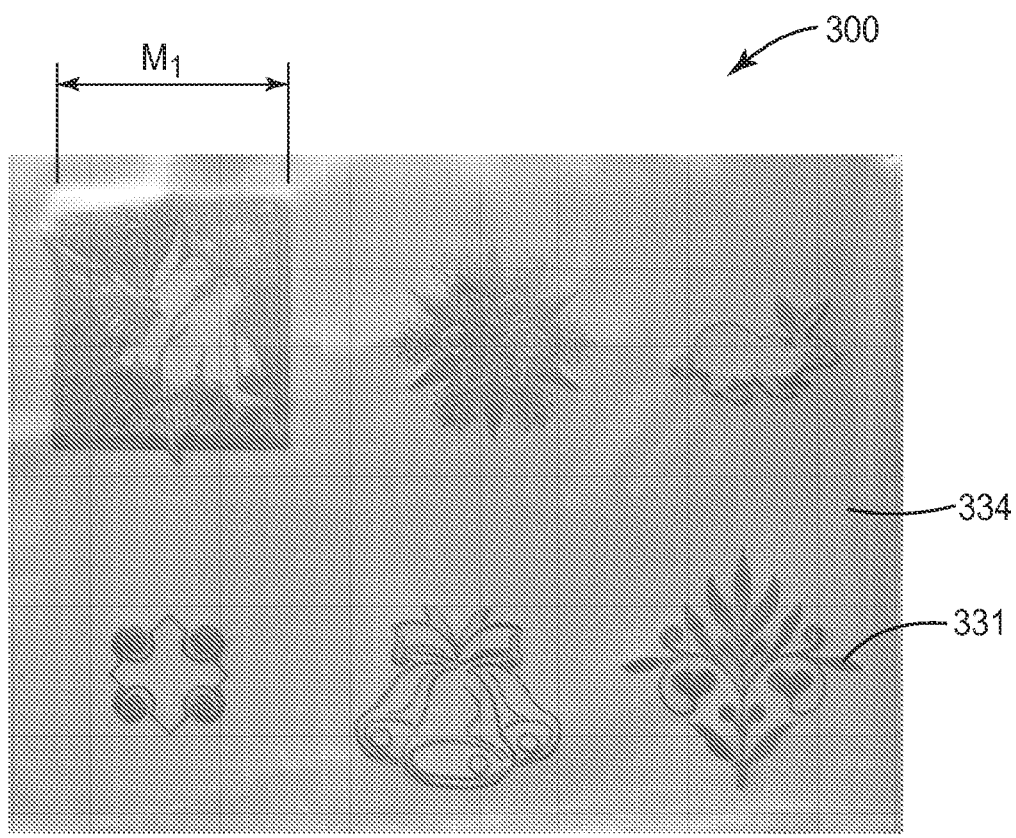
FIG. 3 is a digital photographic image of an exemplary differentially pattern cured microstructured article described herein.

FIG. 3 is a digital photographic image of article 300 produced using the exemplary method illustrated for FIGS. 1A-1E, illustrating a pattern of at least one first region 331 and at least one second region 334 arising from the first, patterned irradiation. At least one first region 331 and at least one second region 334 each include a microstructured surface complementary to the molding tool (i.e., 190 in FIG. 1A) having a microstructured surface.

Figure 4A:
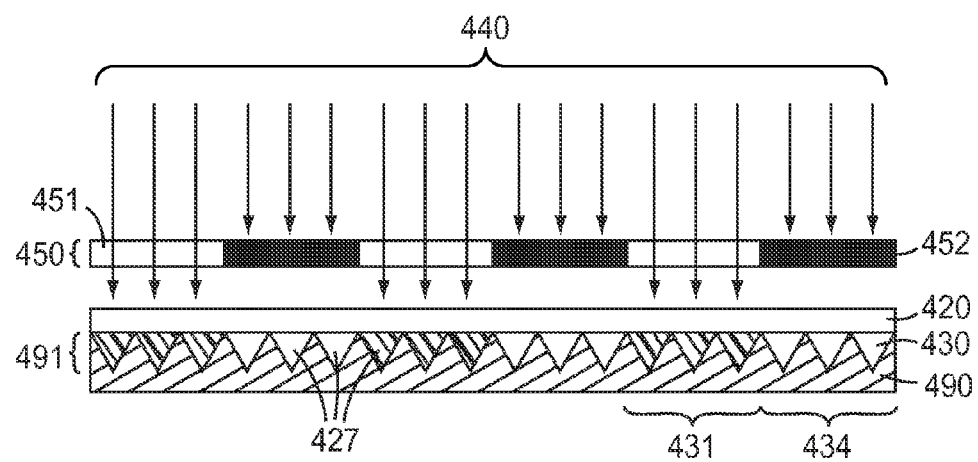
FIGS. 4A to 4C illustrate an exemplary embodiment of a method of the present disclosure for making differentially pattern cured microstructured articles described herein.
Figure 4B:
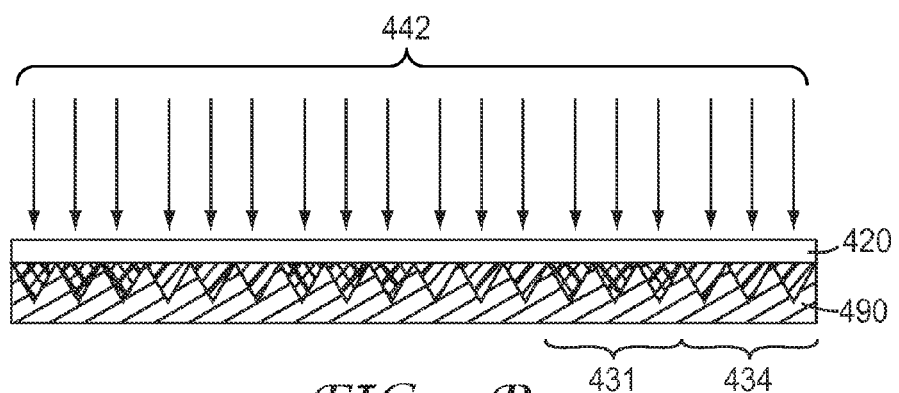
Figure 4C:
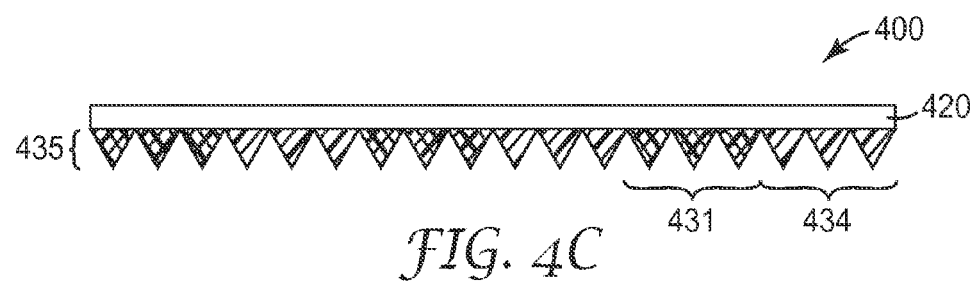

FIGS. 4A to 4C illustrate an exemplary embodiment of a method for making a differentially pattern cured microstructured article. Molding tool 490 has microstructured surface 491 including plurality of cavities 427. Plurality of cavities 427 is at least partially filled with radiation curable resin 430, and overlay element 420 overlays and contacts radiation curable resin 430. Mask 450 overlays overlay element 420, and radiation curable resin 430 is exposed to a patterned irradiation by passing first radiation 440 through radiation transparent regions 451 in mask 450. At least one first region 431 of radiation curable resin 430 is at least partially cured by first irradiation 440, while radiation non-transparent regions 452 in mask 450 block first irradiation 440, forming a partially cured resin comprising a pattern of at least one first region 431 and at least one second region 434, as illustrated in FIG. 4A. At least one second region 434 is not cured by first irradiation 140. Mask 450 is removed, and at least one first region 431 and at least one second region 434 are then both exposed to second irradiation 442, which passes through overlay element 420, as illustrated in FIG. 4B. Second irradiation 142 provides article 400 having a microstructured surface and a differentially cured pattern therein. FIG. 4C shows article 400 having overlay element 420 and differentially cured microstructured layer 135, separated from molding tool 490.

Figure 5:
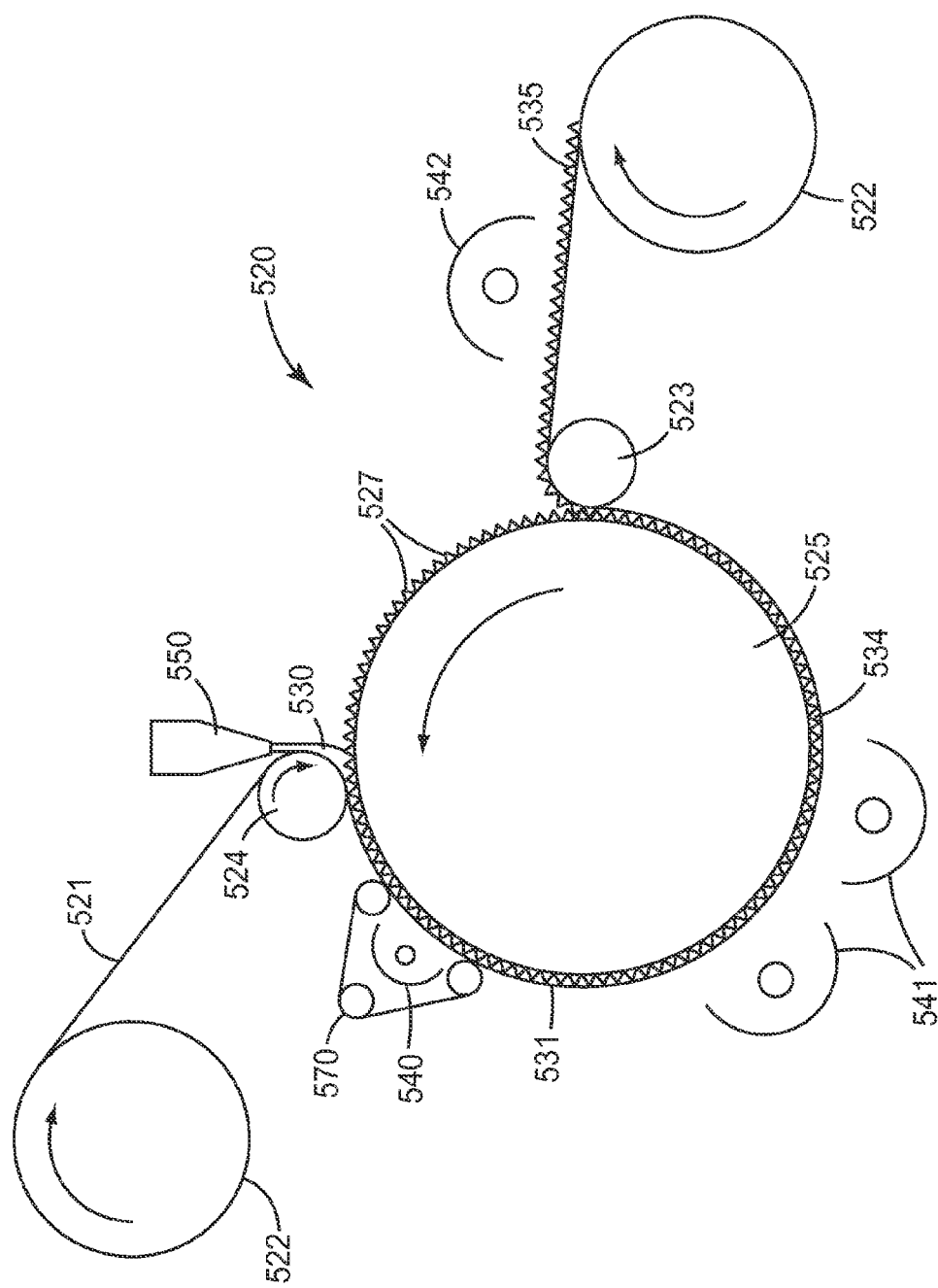
FIG. 5 illustrates an exemplary apparatus for continuous differentially pattern cured microreplication using methods described herein.

FIG. 5 illustrates an exemplary embodiment of a method for continuous differentially pattern cured microreplication, which bears some resemblance to the method illustrated in FIG. 2. Apparatus 520 includes molding tool roll 525, having a microstructured surface that includes plurality of cavities 527. Plurality of cavities 527 is at least partially filled with radiation curable resin 530, delivered from die 550. Radiation-transparent overlay element 521 is nipped against radiation curable resin 530 using roll 524. As molding tool roll 525 is rotated, radiation curable resin 530 passes under mask 570. Mask 570 has radiation transparent regions (not shown) and radiation non-transparent regions (not shown), analogous to radiation transparent regions 451 and radiation non-transparent regions 452 of mask 450 in FIG. 4A. First irradiation source 540 provides a first irradiation of radiation curable resin 530 through the radiation transparent regions of mask 570, resulting in at least one first region of radiation curable resin. The radiation non-transparent regions of mask 570 block the irradiation coming from irradiation source 540, resulting in at least one second region of radiation curable resin. The at least one first region of the radiation curable resin is at least partially cured by the irradiation coming from irradiation source 540, while the at least one second region of the radiation curable resin is not cured. Partially cured composite 531 includes a pattern of irradiated regions and non-irradiated regions, analogous to the pattern of at least one first region 431 and at least one second region 434 illustrated in FIG. 4B.

In the exemplary embodiment illustrated in FIG. 5, partially cured composite 531 is irradiated by second irradiation source 541, forming further cured composite 534. Further cured composite 534 is separated from molding tool roll 525, and passes under third irradiation source 542 to form article 535 having a microstructured surface and a differentially cured pattern therein.

A digital photographic image of an exemplary article 600 resulting from using mask 650 of FIG. 6A is shown in FIG. 6B. Radiation transparent regions 651 in mask 650 allow light (e.g., UV or visible) to pass through mask 650, forming darker first region 631, while opaque regions 652 do not allow light to pass through the mask, resulting in lighter second regions 634.

In some embodiments, the second irradiation may include e-beam irradiation. FIG. 7 shows a digital photographic image of an exemplary article 700 resulting from a first, patterned irradiation using a UV LED light source through the mask of FIG. 6A, followed by a second irradiation using e-beam irradiation, generating the observed differentially cured pattern.

Figure 8A:
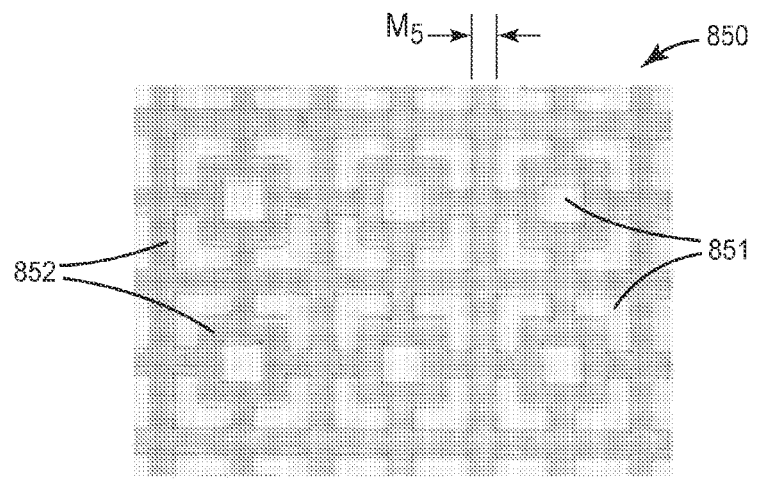
FIG. 8A is a digital photographic image of an exemplary metal mask used herein.
Figure 8B:
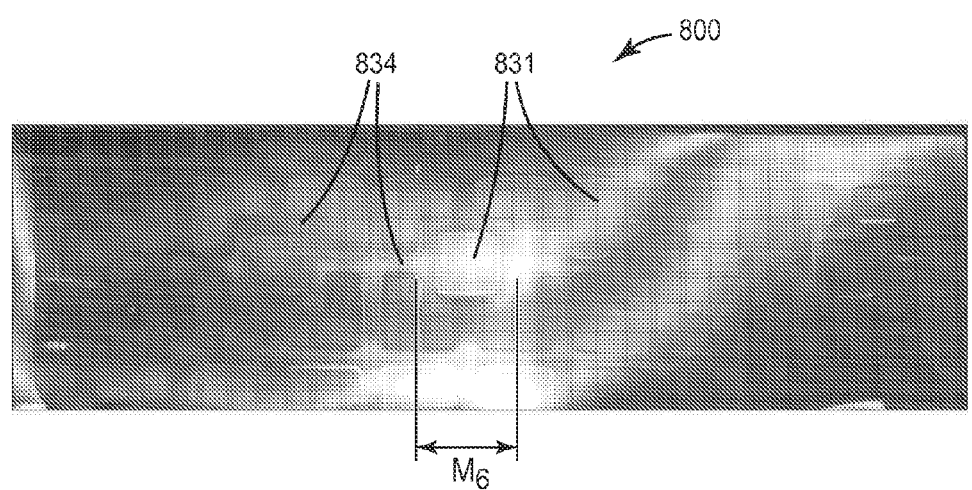
FIG. 8B is a digital photographic image of an exemplary differentially pattern cured microstructured article prepared from the mask in FIG. 8A.

In some other embodiments, where e-beam irradiation is included for the first, patterned irradiation, a metallic (e.g., aluminum) mask is provided to block the first irradiation from reaching non-irradiated regions. A digital photographic image of an exemplary metallic mask 850 is shown in FIG. 8A. E-beam transparent regions 851 in mask 850 allow e-beam irradiation to pass through mask 850, forming darker first regions (not shown), while e-beam opaque regions 852 do not allow e-beam irradiation to pass through mask 850, resulting in lighter second regions (not shown). FIG. 8B is a digital photographic image of article 800 produced according to the process illustrated for FIGS. 4A-4C using e-beam irradiation through e-beam transparent regions 851 in mask 850, illustrating a pattern of at least one first region 831 and at least one second region 834 arising from the first, patterned irradiation. At least one first region 831 and at least one second region 834 each include a microstructured surface complementary to the molding tool (i.e., 490 in FIG. 1A) having a microstructured surface.

Figure 9A:
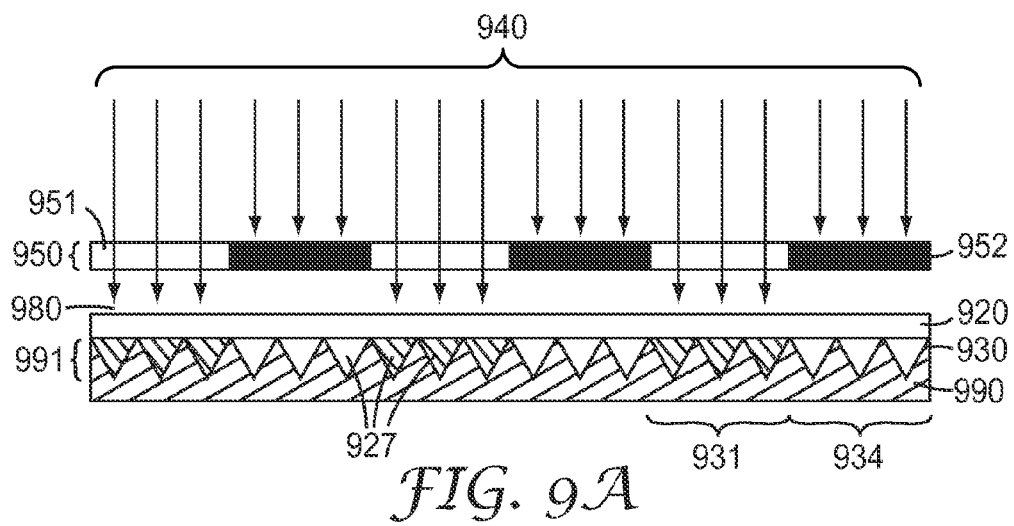
FIGS. 9A to 9E illustrate exemplary embodiments of a method of the present disclosure for making differentially pattern cured microstructured articles.
Figure 9B:
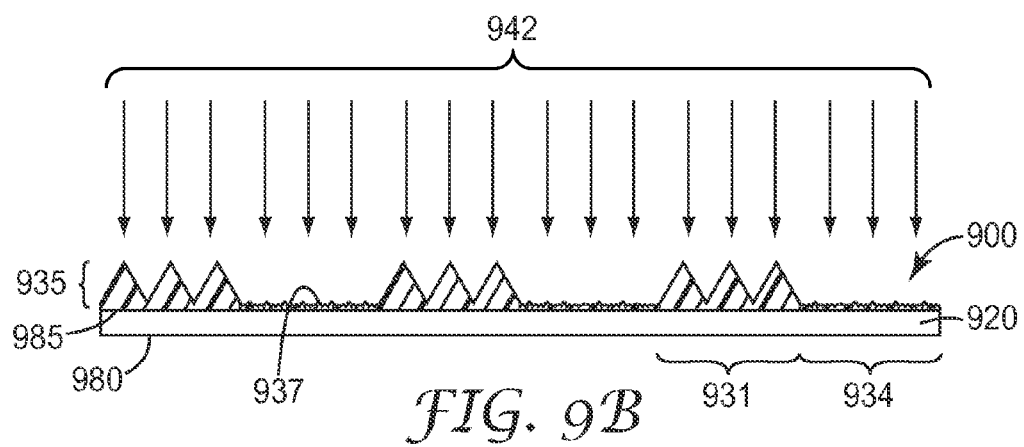

FIGS. 9A and 9B illustrate another exemplary embodiment of a method for making a differentially pattern cured microstructured article. In FIG. 9A, molding tool 990 has a microstructured surface 991 including plurality of cavities 927. Plurality of cavities 927 is at least partially filled with radiation curable resin 930, and overlay element 920 overlays and contacts radiation curable resin 930. In the exemplary embodiment shown in FIG. 9A, overlay element 920 is transparent to first irradiation 940, and overlay element 920 is selected to adhere to radiation curable resin 930 with or without exposure to first irradiation 940. Radiation curable resin 930 is exposed to first irradiation 940 through radiation transparent regions 951 in mask 950. Irradiated regions 931 of radiation curable resin 930 are at least partially cured by first irradiation 940, while radiation non-transparent regions 952 in mask 950 block first irradiation 940 from reaching non-irradiated regions 934, to provide a partially cured composite comprising overlay element 920 adhered to a correspondingly pattern cured resin comprising at least one first region 931 and at least one second region 934, as illustrated in FIG. 9A. Second region 934 is not cured by first irradiation 940. The partially cured composite is separated from molding tool 990, such that at least a portion of radiation curable resin 930 from second region 934 remains in molding tool 990, providing separated partially cured composite 900 with a surface that lacks microstructure in non-irradiated regions 934. In the exemplary embodiment illustrated in FIG. 9B, partially cured composite 900 is exposed to second irradiation 942 to provide composite article 900 having a microstructured surface and a differentially cured pattern therein.

Figure 10:
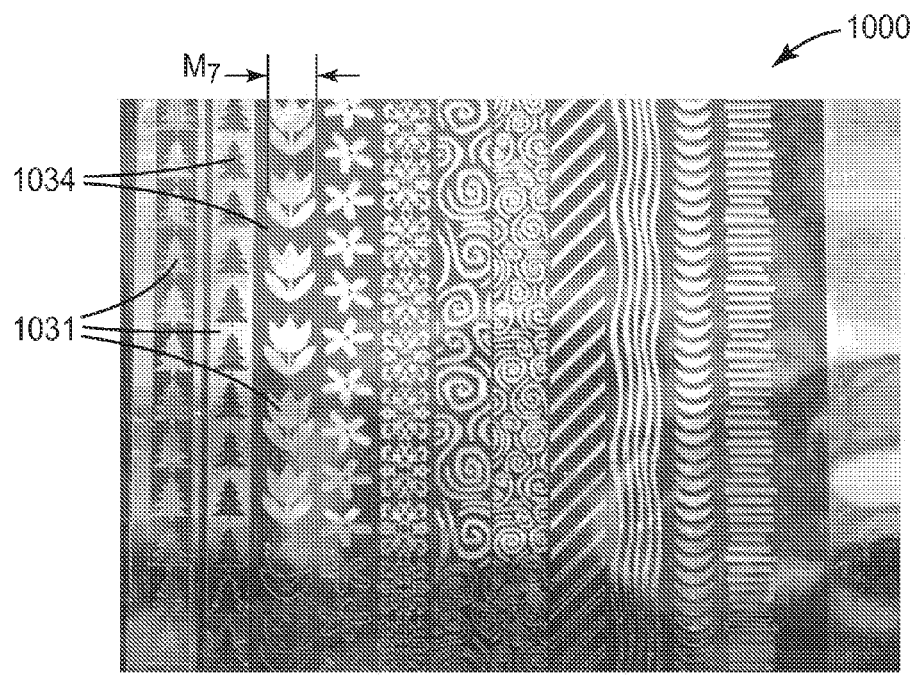
FIGS. 10 to 13 are digital photographic images of exemplary differentially pattern cured microstructured articles described herein.

A digital photographic image (taken against a black background) of composite article 1000 prepared according to the method illustrated for composite article 900 is shown in FIG. 10. Lighter regions 1031 correspond to regions exposed to a first, patterned irradiation, and have a microstructured surface. Darker regions 1034 correspond to non-irradiated regions, and lack a microstructured surface.

Figure 11:
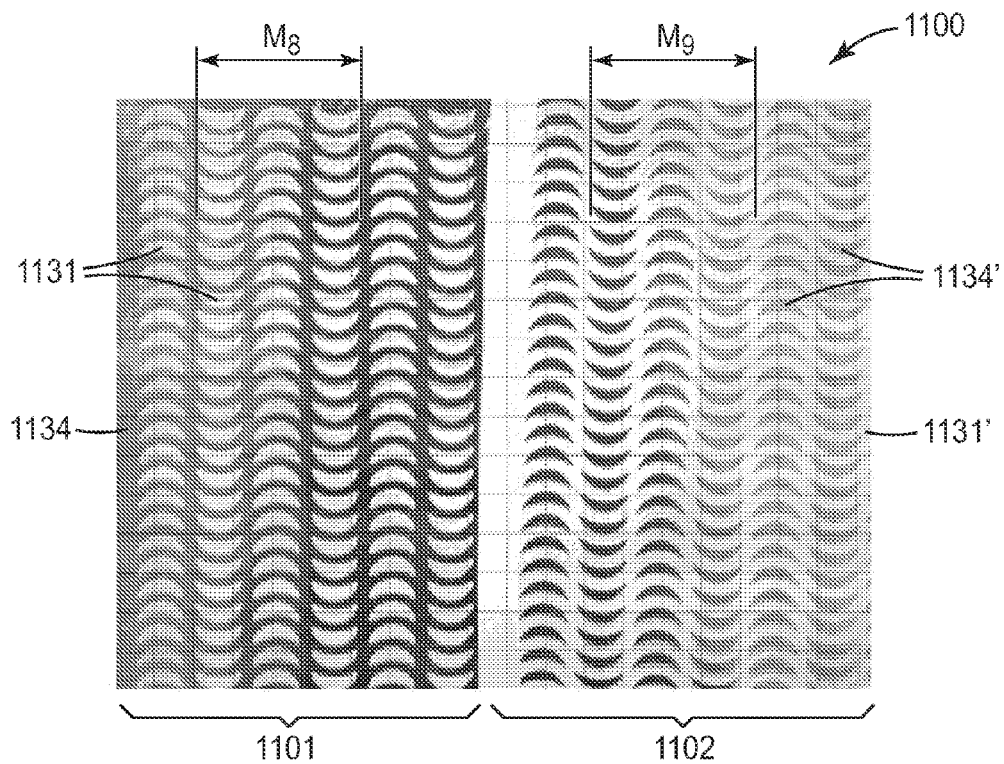

FIG. 11 shows a digital photographic image (taken against grid-lined paper) of a pair of patterns 1100 resulting from using the method illustrated for composite article 900, using a pair of masks that are negative images of each other. On left half 1101 of FIG. 11, crescent shaped regions 1131 correspond to non-irradiated regions that lack a microstructured surface, while darker "background" region 1134 corresponds to an irradiated region, having a microstructured surface. On right half 1102 of FIG. 11, crescent shaped regions 1134' correspond to irradiated regions, having microstructured surfaces, while lighter "background" regions 1131' corresponds to a non-irradiated region, lacking a microstructured surface.

Figure 12:
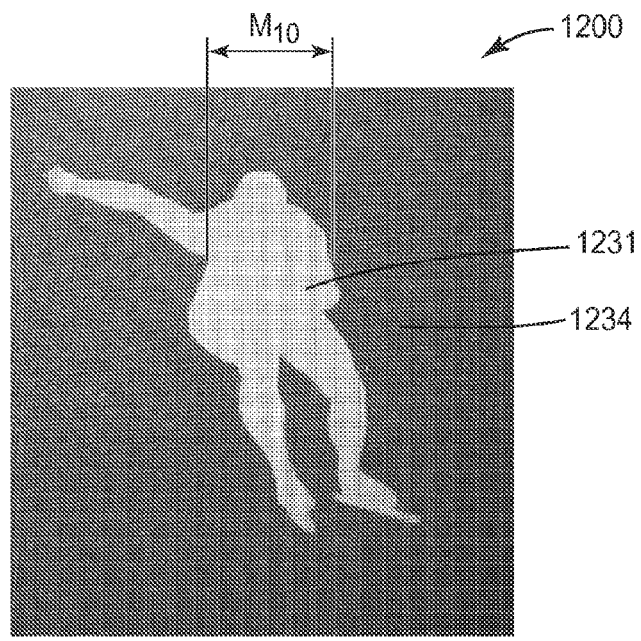

FIG. 12 shows a digital photographic image of another composite article 1200 prepared according to the method illustrated for composite article 900, where lighter region 1231 corresponds to an irradiated region, having a microstructured surface, and darker region 1234 corresponds to a non-irradiated region where the radiation curable resin was removed.

Figure 9C:

FIG. 9C illustrates another exemplary embodiment, where no second irradiation 942 is applied, and instead radiation curable resin 930 in non-irradiated regions 934 of partially cured composite 900 is removed (e.g., by washing with a suitable solvent) to provide composite article 901 having a microstructured surface and a differentially cured pattern therein, having regions of no resin in non-irradiated regions 934. Composite article 901 may subsequently be further irradiated to provide a higher level of cure in irradiated regions 931.

Figure 9D:
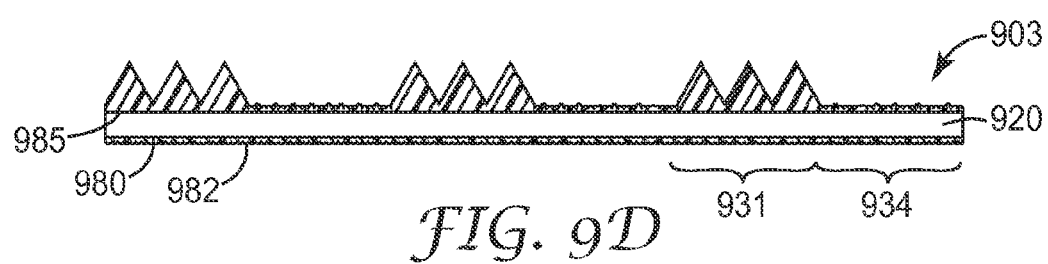
Figure 13:
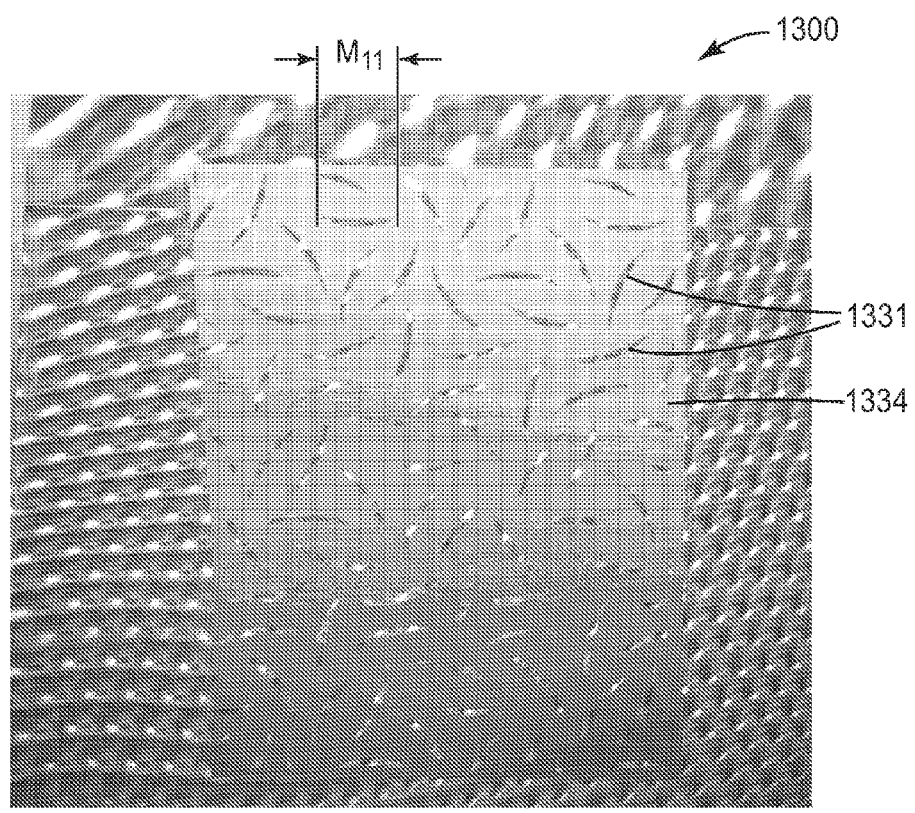

FIG. 9D illustrates an exemplary embodiment where composite article 900 of FIG. 9B has been modified to form microstructured surface 982 on second major surface 980 of overlay element 920 (i.e., opposite first major surface 985 of overlay element 920), second major surface 982 being formed by coating a radiation curable resin onto second major surface 980, contacting the resin with a microstructured surface on a molding tool (not shown), and irradiating the radiation curable resin with a source of irradiation (not shown) to form composite article 903. Composite article 903 has a first major surface having the microstructured surface and a differentially cured pattern therein, and second major surface 982 which is microstructured. In some exemplary embodiments, where at least some regions of composite article 903 are light transmissive, relatively complex visual patterns may be apparent when viewing normal to a major surface of article 903. FIG. 13 shows a digital photographic image of light transmissive composite article 1300 formed according the method illustrated for forming article 903, and a Moiré pattern is observed in regions 1331 (i.e., regions irradiated by a first, patterned irradiation), while the Moiré pattern is not observable in regions 1334 (i.e., regions not irradiated by a first, patterned irradiation, and where no microstructure exists on a first major surface).

Figure 9E:
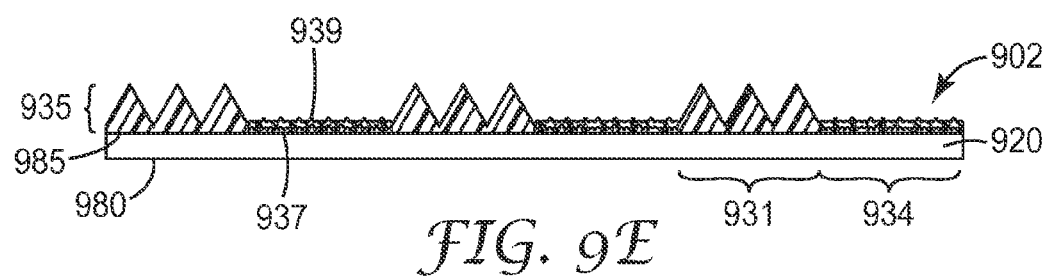
Figure 14A:
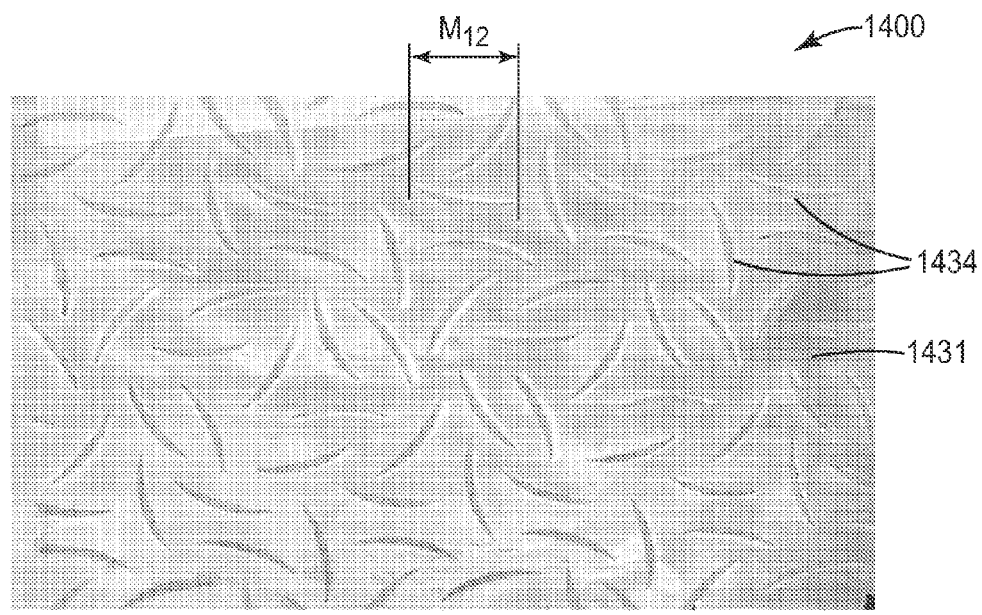
FIGS. 14A and 14B are digital photographic images of an exemplary differentially pattern cured microstructured article described herein.
Figure 14B:
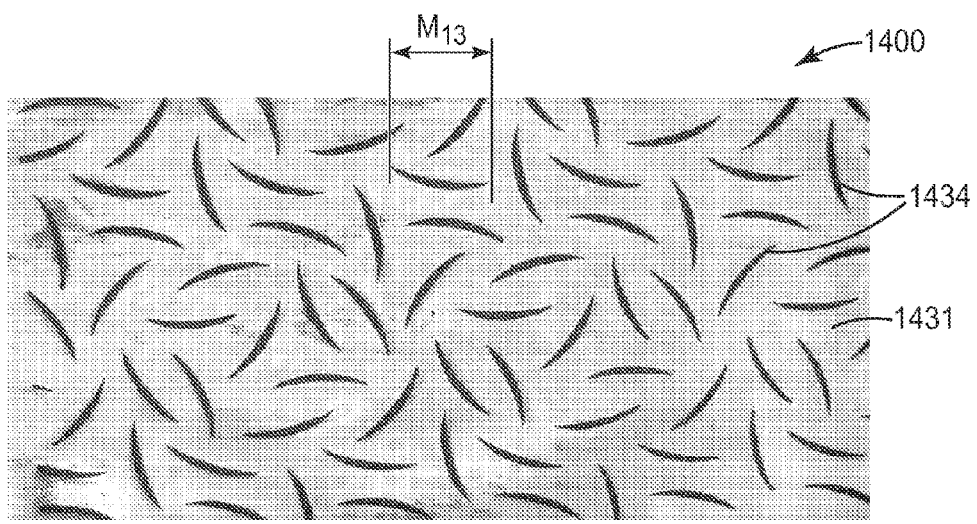

FIG. 9E illustrates another exemplary embodiment of a composite article related to composite article 900, where pigment 939 has been added to non-irradiated regions 934 prior to irradiation with second irradiation 942 (second irradiation 942 is not shown in FIG. 9E), to form composite article 902 having pigment on only non-irradiated regions 943. FIG. 14A is a digital photographic image of composite article 1400 in ambient light, showing non-irradiated regions 1434 that have pigment and no microstructured surfaces, while lighter, irradiated region 1431 has a microstructured surface and no pigment. FIG. 14B shows the same composite article 1400 under retroreflective light conditions, where again the irradiated region 1431 having the microstructure is light, while the non-irradiated regions 1434 lacking microstructure are dark.

Figure 15A:
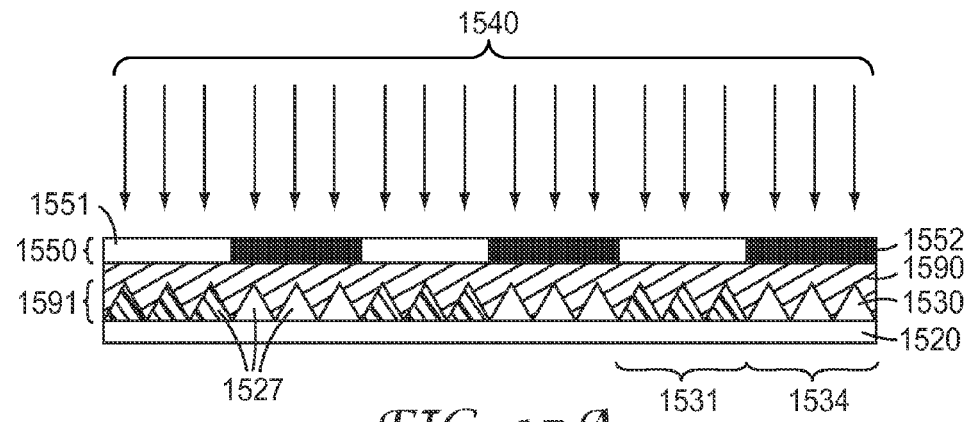
FIGS. 15A to 15C illustrate an exemplary embodiment of a method of the present disclosure for making differentially pattern cured microstructured articles.
Figure 15B:
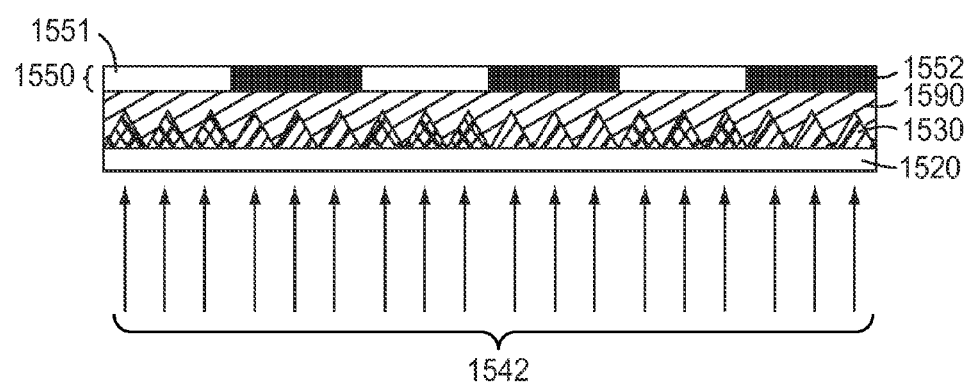
Figure 15C:
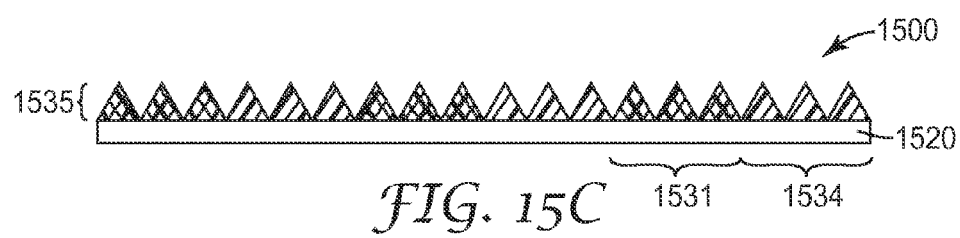
Figure 16A:
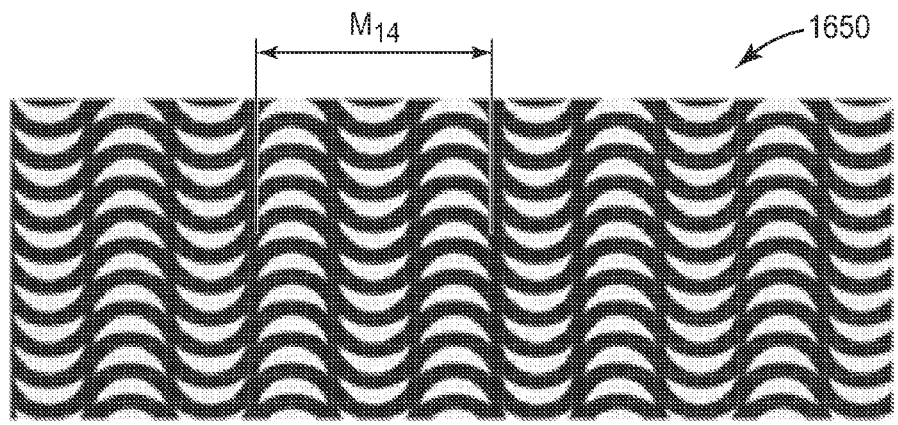
FIGS. 16A and 16B are digital photographic images of exemplary differentially pattern cured microstructured articles described herein.

FIGS. 15A-15C illustrate an exemplary embodiment of a method for producing composite article 1500 having a microstructured surface and a differentially cured pattern therein. Molding tool 1590 has microstructured surface 1591 that includes plurality of cavities 1527 which are at least partially filled with radiation curable resin 1530. Overlay element 1520 contacts radiation curable resin 1530. Radiation curable resin 1530 is exposed to a first, patterned irradiation by passing first irradiation 1540 through radiation transparent regions 1551 in mask 1550, and through molding tool 1590, which is selected to be transparent to first irradiation 1540. Irradiated regions 1531 of radiation curable resin 1530 are at least partially cured by first irradiation 1540, while radiation non-transparent regions 1552 in mask 1550 block first irradiation 1540 from reaching non-irradiated regions 1534, to provide a partially cured composite 1534 comprising overlay element 1520 adhered to a correspondingly pattern cured resin comprising irradiated regions 1531 and non-irradiated regions 1534, as illustrated in FIG. 15A. Non-irradiated regions 1534 are not cured by first irradiation 1540. FIG. 15B illustrates second irradiation 1542 passing through overlay element 1520 (i.e., the first, patterned irradiation and the second irradiation are from opposite faces of the partially cured composite) to form a more completely cured composite, and removal of the more completely cured composite from the molding tool affords composite article 1500 shown in FIG. 15C, having a microstructured surface and a differentially cured pattern therein. FIG. 16A is a digital photographic image of mask 1650 useful in the method illustrated for FIGS. 15A-15C, and FIG. 16B is a digital photographic image of composite article 1600 produced by using mask 1650 in the first, patterned irradiation in the method illustrated for FIGS. 15A-15C.

Figure 17:
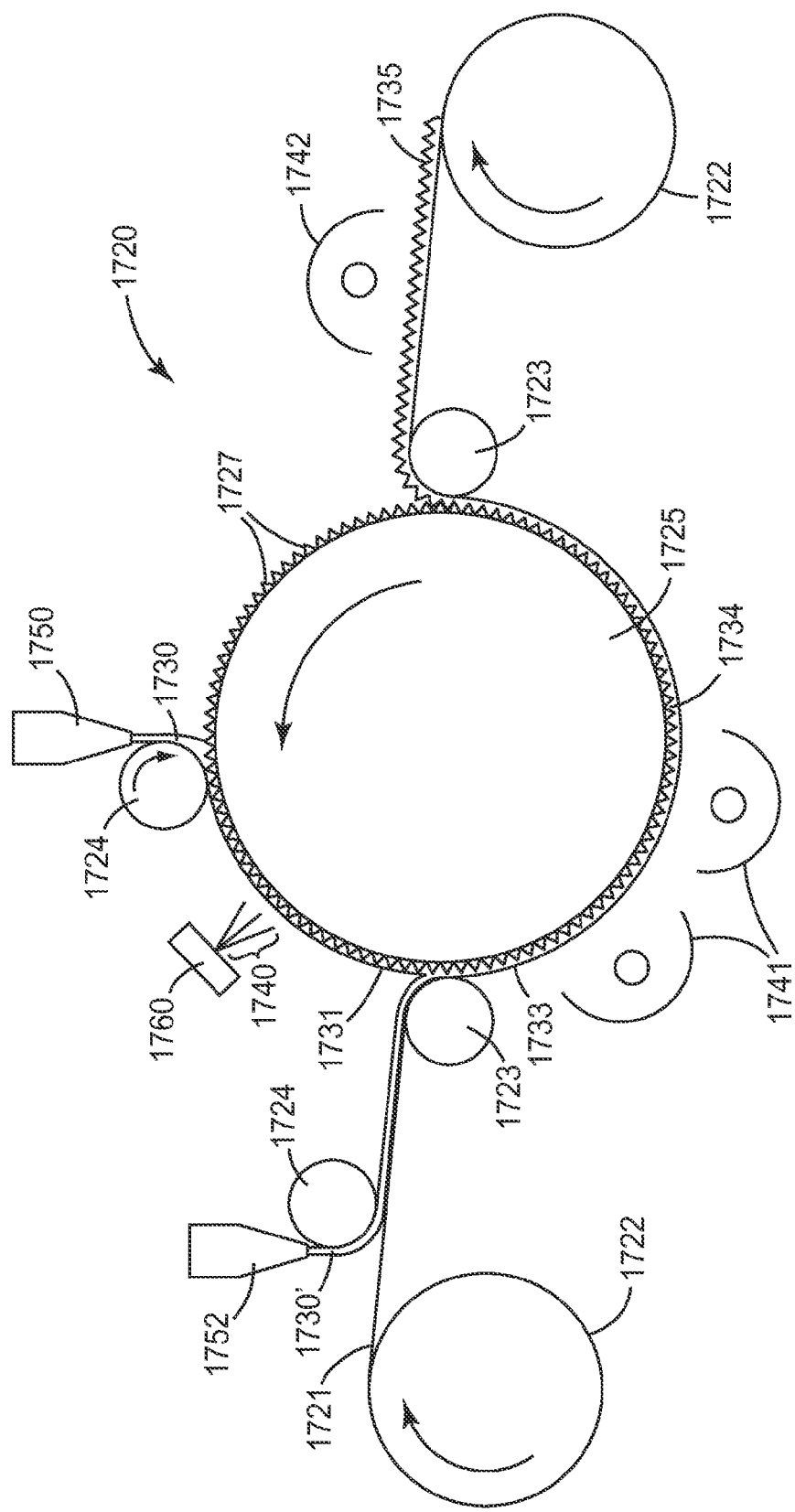
FIG. 17 illustrates an exemplary apparatus and an exemplary method for continuous differentially pattern cured microreplication using a directed light beam.

FIG. 17 illustrates an alternate exemplary embodiment of an apparatus and method similar to that illustrated for FIG. 2, with a difference in that radiation source 1760 is a guided irradiation (e.g., a guided beam of light (e.g., a guided laser)). Apparatus 1720 includes molding tool roll 1725, having a microstructured surface that includes plurality of cavities 1727. Plurality of cavities 1727 is at least partially filled with radiation curable resin 1730, delivered from die 1750 via roll 1724. As molding tool roll 1725 is rotated, radiation curable resin 1730 passes under guided radiation source 1760. Irradiated regions of radiation curable resin 1730 are at least partially cured by first irradiation 1740, while non-irradiated regions of radiation curable resin 1730 are not cured, forming partially cured resin 1731 comprising a pattern of irradiated regions and non-irradiated regions, analogous to the pattern of first region 131 and second region 134 illustrated in FIG. 1B.

In the exemplary embodiment illustrated in FIG. 17, radiation curable resin 1730' is delivered from die 1752 onto a major surface of overlay element 1721 which is then is nipped against partially cured resin 1731 on the microstructured surface of molding tool roll 1725, forming a partially cured composite 1733 that is subsequently irradiated by second irradiation source 1741 to form further cured composite 1734. Further cured composite 1734 is separated from molding tool roll 1725, and passes under third irradiation source 1742 to form article 1735 having a microstructured surface and a differentially cured pattern therein.

In some exemplary embodiments of the method illustrated in FIG. 17, radiation curable resins 1730 and 1730' may be the same as each other. In some other exemplary embodiments, radiation curable resins 1730 and 1730' may be different from each other.

Overlay element 1721 is shown in FIG. 17 as being supplied from roll 1722. In some exemplary embodiments, a carrier layer (not shown) can be provided on a major surface of the overlay element that is opposite a major surface of the overlay element being coated with radiation curable resin 1730'. The carrier layer (not shown) may become incorporated into article 1735 (e.g., the carrier layer (not shown) may be firmly adhered to overlay element 1721), or the carrier layer (not shown) may be removably associated with overlay element 1721 and removed after the second irradiation.

Figure 18:
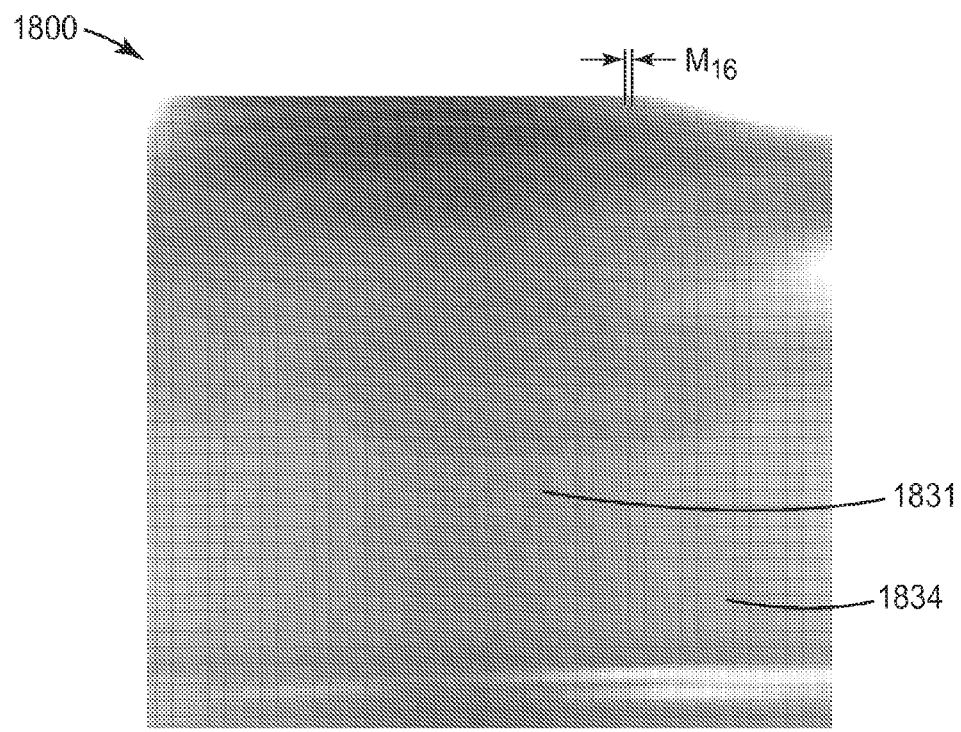
FIGS. 18 and 19 are digital photographic images of exemplary differentially pattern cured microstructured articles described herein.

FIG. 18 is a digital photographic image of an exemplary embodiment of composite article 1800 produced according to the method illustrated for FIG. 17, where radiation curable resins 1730 and 1730' are selected to be the same as each other, and wherein the patterned irradiation uses a laser. Irradiated region 1831 and non-irradiated region 1834 together form a microstructured surface having a differentially cured pattern therein.

Figure 19:
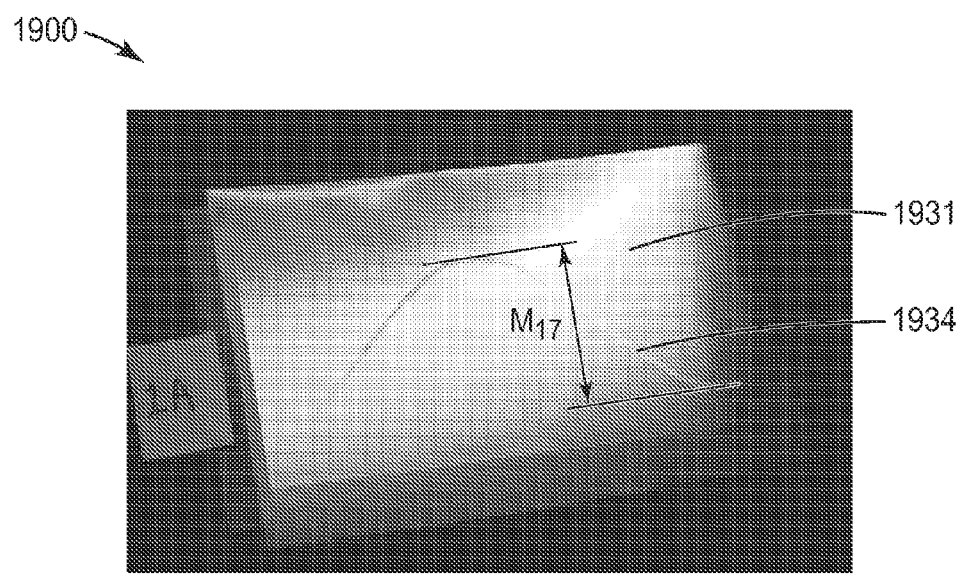

FIG. 19 is a digital photographic image of another exemplary embodiment of composite article 1800 produced according to the method illustrated for FIG. 17, where the radiation curable resins 1730 and 1730' are selected to be different from each other. Irradiated region 1931 and non-irradiated region 1934 together form a microstructured surface having a differentially cured pattern therein. A comparison of the composite articles of FIG. 18 and FIG. 19 shows a greater contrast between irradiated region 1931 and non-irradiated region 1934 of composite article 1900, relative to the contrast between irradiated region 1831 and non-irradiated region 1834 of composite article 1800.

Figure 20:
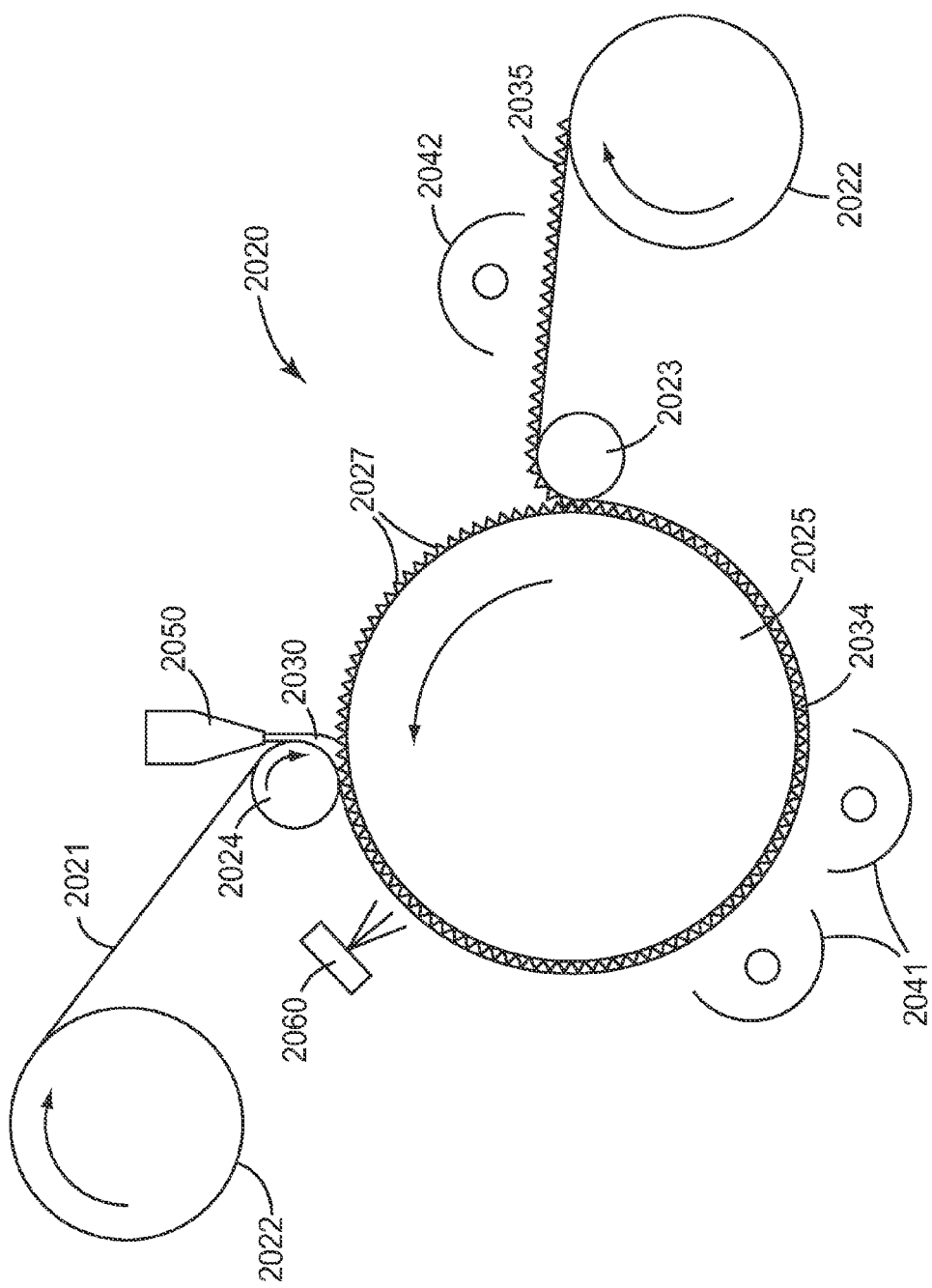
FIG. 20 illustrates an apparatus and an exemplary method for continuous differentially pattern cured microreplication using a directed light beam.

FIG. 20 illustrates an alternate exemplary embodiment of an apparatus and method similar to that illustrated for FIG. 5, with a difference in that radiation source 2060 is a guided irradiation (e.g., a guided beam of light (e.g., a guided laser)). Apparatus 2020 includes molding tool roll 2025, having a microstructured surface that includes plurality of cavities 2027. Plurality of cavities 2027 is at least partially filled with radiation curable resin 2030, delivered from die 2050. Radiation-transparent overlay element 2021 is nipped against radiation curable resin 2030 using roll 2024. As molding tool roll 2025 is rotated, radiation curable resin 2030 passes under guided radiation source 2060. Irradiated regions of radiation curable resin 2030 are at least partially cured by first irradiation 2040, while non-irradiated regions of radiation curable resin 2030 are not cured, forming partially cured resin 2031 comprising a pattern of irradiated regions and non-irradiated regions, analogous to the pattern of irradiated regions 431 and non-irradiated regions 434 illustrated in FIG. 4B.

In the exemplary embodiment illustrated in FIG. 20, partially cured composite 2031 is irradiated by second irradiation source 2041, forming a further cured composite 2034. Further cured composite 2034 is separated from molding tool roll 2025, and passes under third irradiation source 2042 to form article 2035 having a microstructured surface and a differentially cured pattern therein.

Figure 21:
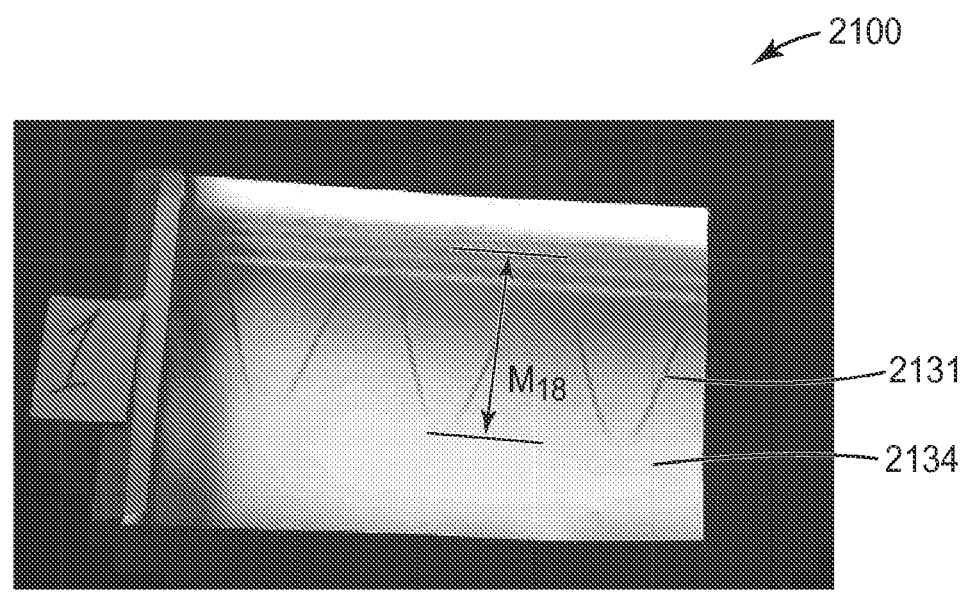
FIG. 21 is a digital photographic image of an exemplary differentially pattern cured microstructured article described herein.

FIG. 21 is a digital photographic image of an exemplary embodiment of composite article 2100 produced according to the method illustrated for FIG. 20. First region 2131 and second region 2134 together form a microstructured surface having a differentially cured pattern therein.

Figure 22A:
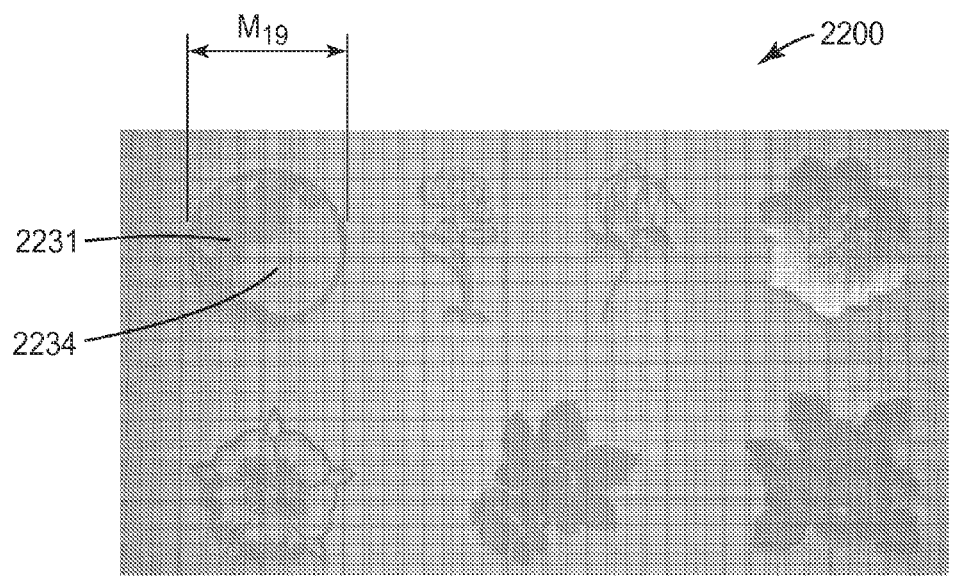
FIGS. 22A and 22B are digital photographic images of an exemplary differentially pattern cured microstructured article described herein.
Figure 22B:
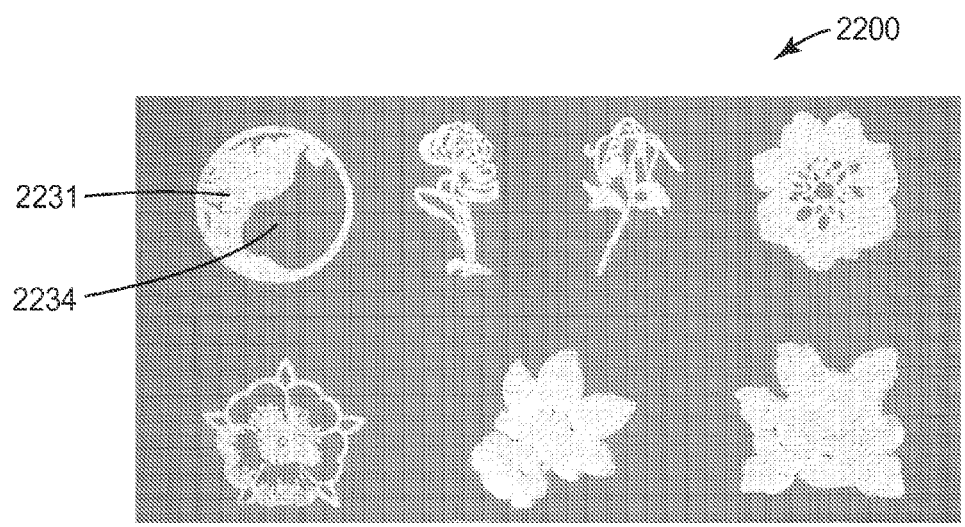

FIG. 22A is a digital photographic image of an exemplary embodiment of a composite article produced according to a method of the present disclosure, where the radiation curable resin is supported on a layer of fabric. First region 2231 and second region 2234 together form a microstructured surface having a differentially cured pattern therein. Any suitable fabric may be used that does not adversely interfere with radiation curing of the radiation curable resin. For example, a suitable fabric includes a nylon fabric. FIG. 22B shows the same sample as in FIG. 22A, but in retroreflective lighting conditions.

Figure 23:
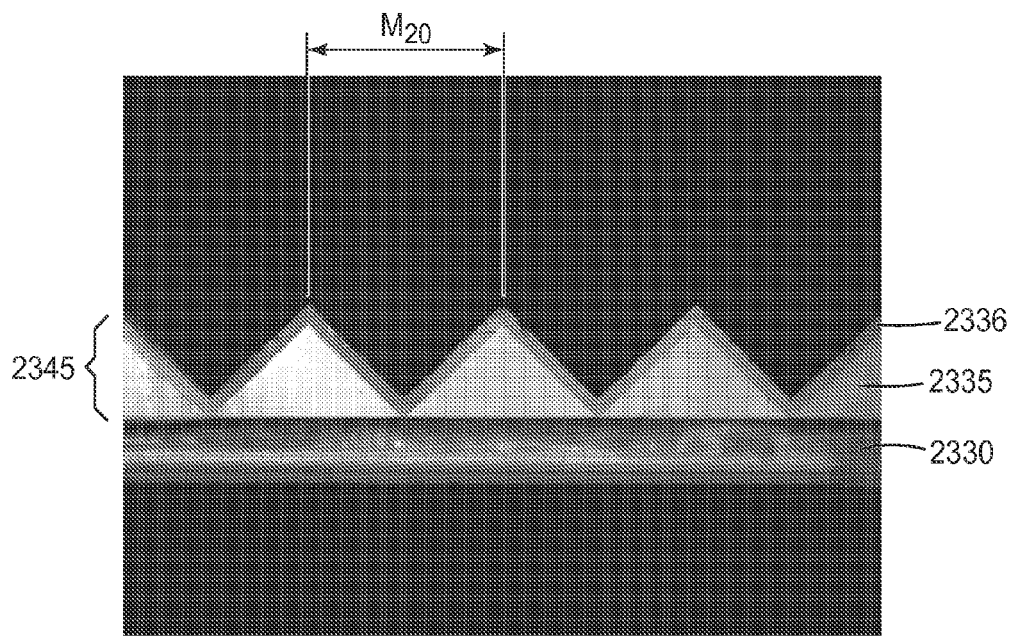
FIG. 23 is a microscopic profile image of an exemplary differentially pattern cured microstructured article described herein.

FIG. 23 is a micrograph of a cross-sectioned sample of an exemplary embodiment of composite article 2400 (see FIG. 24), having more than one differentially pattern-cured layer within microstructured layer 2345. First layer 2336 comprises a first radiation curable resin that has been differentially pattern-cured to include first region 2431, and second layer 2335 comprises a second radiation curable resin that has been differentially pattern-cured to include first region 2436 (i.e., it is seen that the microstructured layer can include more than one differentially pattern-cured layer, having a different pattern in each layer).

Figure 25A:
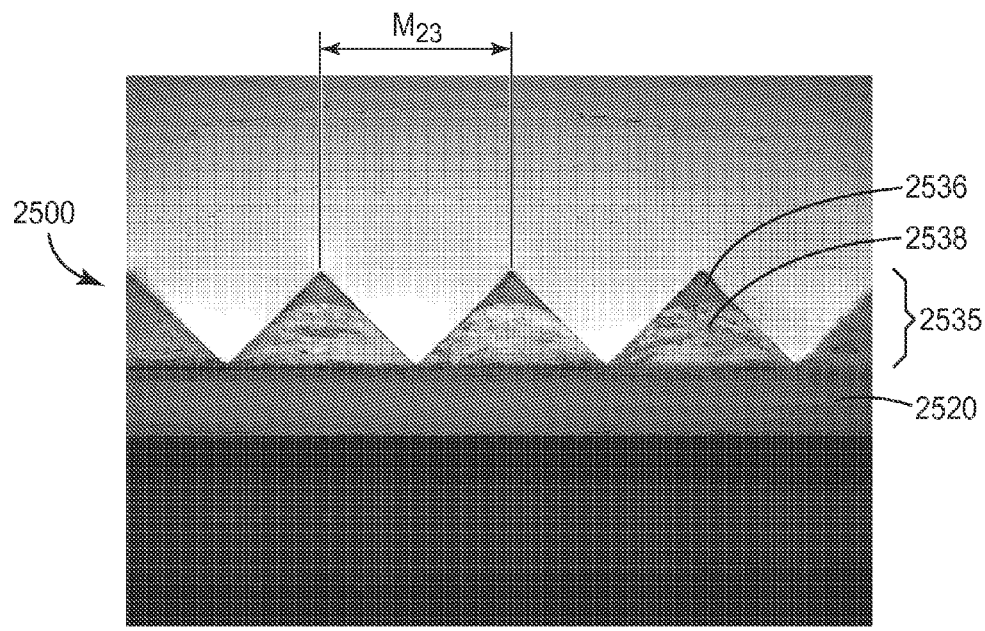
FIG. 25A is a microscopic profile image of an exemplary differentially pattern cured microstructured article described herein.

FIG. 25A is a micrograph of a cross-sectioned sample of an exemplary embodiment of composite article 2500 (see FIG. 25B), having more than one differentially pattern-cured layer within microstructured layer 2535. First layer 2536 comprises a first radiation curable resin that has been differentially pattern-cured to include first region 2531 and second region 2534, and second layer 2538 comprises a second radiation curable resin that has been differentially pattern-cured to include first region 2539 and second region 2540 (i.e., it is again seen that the microstructured layer can include more than one differentially pattern-cured layer, having a different pattern in each layer).

Figure 26A:
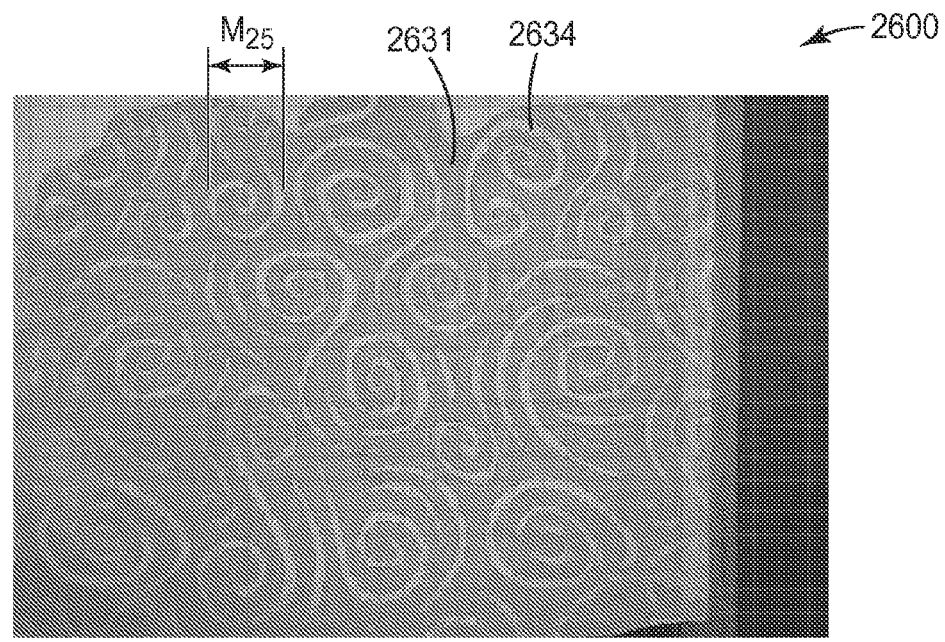
FIGS. 26A and 26B are digital photographic images of an exemplary differentially pattern cured microstructured article described herein.
Figure 26B:
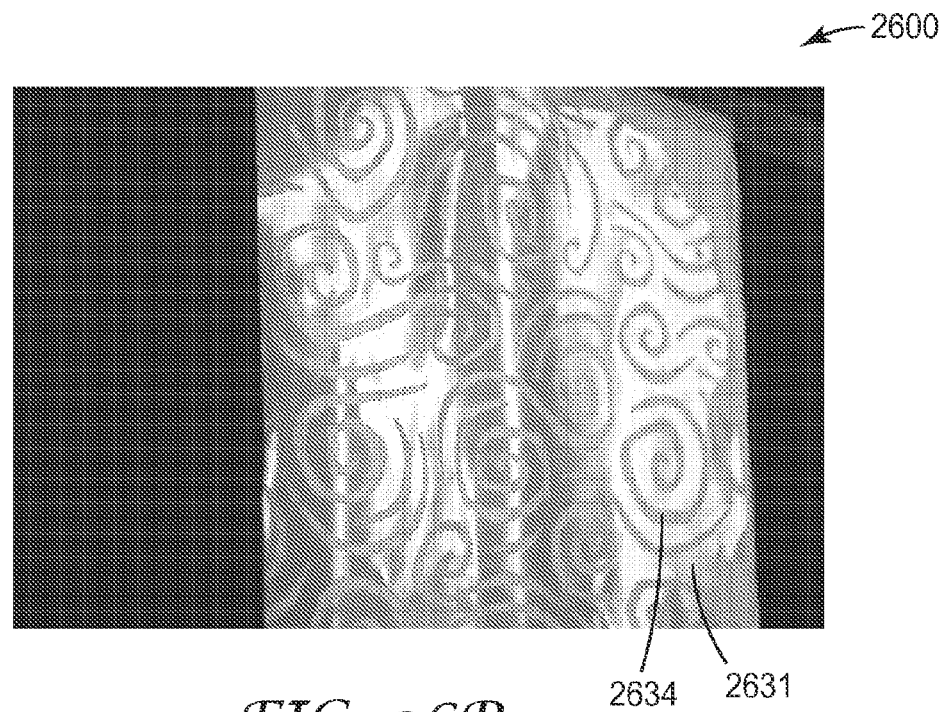

FIGS. 26A and 26B illustrate an exemplary embodiment of composite article 2600 wherein the overlay element is a sheet of copper, and first region 2631 and second region 2634 together comprise the differentially pattern-cured layer having a microstructured surface. FIG. 26B shows the reflective characteristics of the microstructured surface.

In embodiments of the methods described herein that require irradiation, examples of types of irradiation include electron beam, ultraviolet light, and visible light. Electron beam radiation, which is also known as ionizing radiation, can be used typically at a dosage in a range from about 0.1 Mrad to about 10 Mrad (more typically in a range from about 1 Mrad to about 10 Mrad. Ultraviolet radiation refers to non-particulate radiation having a wavelength within the range of about 200 to about 400 nanometers (typically within the range of about 250 to about 400 nanometers). Typically, the ultraviolet radiation can be provided by ultraviolet lights at a dosage of 50 to 1500 millijoules/cm$^2$. Visible radiation refers to non-particulate radiation having a wavelength within the range of about 400 nanometers to about 700 nanometers.

Any suitable patterned irradiation can be used that provides a correspondingly patterned partially cured resin having at least one first region and at least one second region, wherein the at least one first region is irradiated by the patterned irradiation and the at least one second region is not irradiated by the patterned irradiation.

An example of patterned irradiation of radiation curable resin includes at least one of irradiating through transparent regions of a mask, guiding a beam of light, guiding a beam of electrons, or projecting a digital image. Combinations of these patterned irradiation techniques may also be used. Suitable adjustment of power level, irradiation time, and distance from the radiation curable resin may be made to obtain a desired level of curing of the resin.

Embodiments of irradiating through transparent regions of a mask include using a mask having at least one transparent region and at least one opaque region. The transparency and opacity of regions in the mask are selected with respect to the irradiation source(s). For example, when the irradiation source is visible light, a suitable mask can include a film that is transparent to visible light and having at least one opaque (to visible light) region printed thereon (e.g., by a laser printer). In other embodiments, when the irradiation source is UV light, a suitable mask can include can include a film that is transparent to visible light and having at least one opaque (to UV light) region printed thereon. In other embodiments, where, for example, electron beam irradiation is used, a suitable mask may include a sheet of aluminum having open (i.e., transparent) regions therein.

In some embodiments, the radiation curable resin is at least partially curable by visible light, and a suitable irradiation source provides at least visible light and is other than a laser light source. Suitable examples of visible light sources are well known in the art (e.g., fluorescent lamps).

In some embodiments, the radiation curable resin is at least partially curable by UV light, and a suitable irradiation source provides at least UV light and is other than a laser light source. Suitable irradiation sources that provide UV light are well known in the art, and include, for example, an array of light emitting diode (LED) lamps (including those available, for example, from Clearstone Technologies, Minneapolis, Minn., under the trade designation "MODEL LN 120-395B-120"), and in some embodiments the irradiation conditions include irradiating with 395 nanometer UV light with an energy output level of about 170 milliwatts per square centimeter.

In some embodiments, the radiation source can be a laser providing a beam of light. The beam of light can be guided relative to the radiation curable resin (e.g., with mirrors, or by moving the molding tool, or both) to generate the patterned irradiation. The laser used for irradiating the radiation curable resin may be any suitable laser operating at a visible and/or ultraviolet output wavelength. Examples of suitable lasers include gas lasers, excimer lasers, solid state lasers, and chemical lasers. Exemplary gas lasers include: argon-ion lasers (e.g., those which emit light at 458 nm, 488 nm or 514.5 nm); carbon-monoxide lasers (e.g., those which can produce power of up to 500 kW); and metal ion lasers, which are gas lasers that generate deep ultraviolet wavelengths (e.g., helium-silver (HeAg) 224 nm lasers and neon-copper (NeCu) 248 nm lasers).

Chemical lasers include excimer lasers, which are powered by a chemical reaction involving an excited dimer (i.e., an "excimer") having a short-lived dimeric or heterodimeric molecule formed from two species (atoms), at least one of which is in an excited electronic state. They typically produce ultraviolet light. Commonly used excimer molecules include noble gas compounds (KrCl (222 nm), KrF (248 nm), XeCl (308 nm), and XeF (351 nm)).

Solid state laser materials are commonly made by doping a crystalline solid host with ions that provide the required energy states. Examples include ruby lasers (e.g., made from ruby or chromium-doped sapphire). Another common type is made from neodymium-doped yttrium aluminum garnet (YAG), known as Nd:YAG. Nd:YAG lasers can produce high powers in the infrared spectrum at 1064 nm. Nd:YAG lasers are also commonly frequency doubled to produce 532 nm when a visible (green) coherent source is desired.

The laser may be used in pulsed and/or continuous wave mode. For example, the laser may operate at least partially in continuous wave mode and/or at least partially in pulsed mode.

The laser beam is typically optically directed or scanned and modulated to achieve the desired irradiation pattern. The laser beam may be directed through a combination of one or more mirrors (e.g., rotating mirrors and/or scanning mirrors) and/or lenses. Alternatively or in addition, the substrate can be moved relative to the laser beam.

In some embodiments, the source of irradiation is a beam of electrons. A suitable mask (e.g., an aluminum mask) can be used in conjuction with the beam of electrons to generate a patterned irradiation. An example of a suitable electron beam ("e-beam") system is available from Energy Sciences Inc., Wilmington, Mass., under the trade designation "MODEL CB-300 ELECTRON BEAM SYSTEM". Alternatively, electron beam lithography can be used to guide a beam of electrons in a patterned irradiation. Suitable operating conditions can be selected depending on the radiation curable resin being used. In some embodiments, the electron beam system can be operated at 200 kV voltage to deliver a dose of 2-5 megarads to provide cure to the radiation curable resin.

In some embodiments, methods described herein include irradiation using a projection of a digital image. Any suitable projection technique to project irradiation as a digital image may be used. Projection of a digital image may be achieved, for example, using a plane light source with cooperation of a digital micromirror device or liquid crystal display to scan selected zones of the radiation curable resin to cause a patterned irradiation, as has been used in rapid prototyping technology (see, e.g., U.S. Pat. No. 7,079,915 (Huang et al.)).

In some embodiments, methods of the present disclosure include a blanket irradiation (i.e., non-patterned irradiation) with an irradiation that can be at least one of electron beam, ultraviolet light, and visible light. Blanket irradiation is useful for providing at least a partial curing of non-irradiate regions of radiation curable resin, as well as potentially providing additional curing for previously irradiated regions (i.e., regions that have been irradiated with a patterned irradiation). Advantageously, blanket irradiation promotes dimensional and chemical stability of radiation curable resin. In some embodiments, blanket irradiation results in the absence, or near absence, of unpolymerized precursors in the radiation curable resin.

Compositions curable by UV irradiation generally include at least one photoinitiator. The photoinitiator can be used at a concentration in a range from 0.1 wt. % to 10 wt. %. More typically, the photoinitiator is used at a concentration in a range from 0.2 wt. % to 3 wt. %.

In general the photoinitiator is at least partially soluble (e.g., at the processing temperature of the resin) and substantially colorless after being polymerized. The photoinitiator may be colored (e.g., yellow), provided that the photoinitiator is rendered substantially colorless after exposure to the UV light source.

Suitable photoinitiators include monoacylphosphine oxide and bisacylphosphine oxide. Available mono or bisacylphosphine oxide photoinitiators include 2,4,6-trimethylbenzoydiphenylphosphine oxide, available from BASF Corporation, Clifton, N.J., under the trade designation "LUCIRIN TPO", ethyl-2,4,6-trimethylbenzoylphenyl phosphinate, also available from BASF Corporation, under the trade designation "LUCIRIN TPO-L", and bis(2,4,6-trimethylbenzoyl)-phenylphosphine oxide available from Ciba Specialty Chemicals, Tarrytown, N.Y., under the trade designation "IRGACURE 819". Other suitable photoinitiators include 2-hydroxy-2-methyl-1-phenyl-propan-1-one, available from Ciba Specialty Chemicals, under the trade designation "DAROCUR 1173", as well as other photoinitiators available from Ciba Specialty Chemicals, under the trade designations "DAROCUR 4265", "IRGACURE 651", "IRGACURE 1800", "IRGACURE 369", "IRGACURE 1700", and "IRGACURE 907".

Free radical scavengers or antioxidants may be used, typically, in a range from about 0.01 wt. % to 0.5 wt. %. Suitable antioxidants include hindered phenolic resins such as those available from Ciba Specialty Chemicals, under the trade designations "IRGANOX 1010", "IRGANOX 1076", "IRGANOX 1035", and "IRGAFOS 168".

Radiation curable resin that forms the articles of the present disclosure can be cured in one or more steps. For example, radiation sources (e.g., 140, 240, 440, 540, 940, 1540, 1760, or 2060) expose a radiation curable resin to radiation (e.g., ultraviolet light, visible light, e-beam) depending on the nature of the radiation curable resin.

Exemplary polymeric materials include polycarbonates; polypropylenes; polyethylenes; styrene acrylonitrile copolymers; styrene (meth)acrylate copolymers; polymethylmethacrylate; styrene maleic anhydride copolymers; nucleated semi-crystalline polyesters; copolymers of polyethylenenaphthalate; polyimides; polyimide copolymers; polyetherimide; polystyrenes; syndiodactic polystyrene; polyphenylene oxides; copolymers of acrylonitrile, butadiene, and styrene; functionally-modified polyolefins; and polyurethanes.

Exemplary UV curable polymeric materials include reactive resin systems capable of being cross-linked by a free radical polymerization mechanism by exposure to actinic radiation (e.g., electron beam, ultraviolet light, or visible light). These materials may also be polymerized thermally with the addition of a thermal initiator (e.g., benzoyl peroxide). Radiation-initiated cationically polymerizable resins also may be used. Reactive resins suitable for forming the array of elements may be blends of photoinitiator and at least one compound bearing an acrylate group. Preferably, the resin blend contains a monofunctional, a difunctional, or a polyfunctional compound to ensure formation of a cross-linked polymeric network upon irradiation.

Illustrative examples of resins that are capable of being polymerized by a free radical mechanism that can be used herein include acrylic-based resins derived from epoxies, polyesters, polyethers, and urethanes, ethylenically unsaturated compounds, aminoplast derivatives having at least one pendant acrylate group, isocyanate derivatives having at least one pendant acrylate group, epoxy resins other than acrylated epoxies, and mixtures and combinations thereof. The term acrylate is used here to encompass both acrylates and methacrylates.

A molding tool of the present disclosure can include a roll, a continuous belt, a film, and a plate. For continuous production of articles of the present disclosure, the molding tool is typically a roll or a belt. The molding tool has a microstructured molding surface having a plurality of cavities opening thereon which have the shape and size suitable for forming desired elements (e.g., cube-corner elements). The cavities, and thus resultant elements may be, for example, cube-corner elements such as three sided pyramids having one cube-corner each (e.g., as are disclosed in the U.S. Pat. No. 4,588,258 (Hoopman)) have a rectangular base with two rectangular sides and two triangular sides such that each element has two cube-corners each (e.g., as are disclosed in U.S. Pat. No. 4,938,563 (Nelson et al.)), or of other desired shape, having at least one cube corner each (e.g., as are disclosed in U.S. Pat. No. 4,895,428 (Nelson et al.)). It will be understood by those skilled in the art that any cube-corner element may be used in accordance with the present disclosure. The shape of the tooling cavities, and thus resultant article structures, may also be, for example, curve-sided prisms, truncated pyramids, lenslets, micro-needles, fasteners, stems, micro-flow channels and a variety of other geometries. The pitch of the surface refers to the repeat distance from one cavity or structure to the next adjacent cavity or structure.

In some embodiments of the method described herein, the molding tool is transparent to at least one of the irradiations, and the irradiation can then be performed by irradiation through a transparent molding tool, such as disclosed in U.S. Pat. No. 5,435,816 (Spurgeon et al.) and U.S. Pat. No. 5,425,848 (Haisma et al.). In some embodiments, the patterned irradiation passes through a transparent molding tool before it reaches the radiation curable resin in the molding tool. In some embodiments, a non-patterned irradiation passes through a transparent molding tool before it reaches the radiation curable resin in the molding tool.

In some embodiments, the overlay element may be an overlay film. The overlay film can be any conventional film used for such purpose, including ionomeric ethylene copolymers, plasticized vinyl halide polymers, acid-functional ethylene copolymers, aliphatic polyurethanes, aromatic polyurethanes, other radiation transmissive elastomers, and combinations thereof. In some embodiments, the overlay film may be a light transmissive support layer.

In some embodiments, articles described herein include a reinforcing material. The reinforcing material may include any suitable material, including at least one of a woven material, a nonwoven material, a filament, a yarn, or a wire.

In some embodiments, articles described herein include a colorant material (e.g., fluorescent particles). In some embodiments, the colorant material includes at least one of dye or pigment (e.g., Saturn Yellow).

In some embodiments, articles of the present disclosure have a first major surface comprising first microstructural features and second microstructural features arranged in a pattern visible at least when viewed normal to the first major surface, wherein the first and second microstructural features are different relative to each other, and are selected from the group consisting of cones, diffraction gratings, lenticulars, segments of a sphere, pyramids, cylinders, fresnels, prisms, and combinations thereof. In some embodiments, the first microstructural features have a first pitch, wherein the first pitch is no greater than 1000 micrometers (in some embodiments, no greater than 500, 100, 50, 20, 10, 5, 2, 1, 0.5, 0.2, or even no greater than 0.1 micrometer). In some embodiments, the second microstructural features have a second pitch, wherein the second pitch is no greater than 1000 micrometers (in some embodiments, no greater than 500, 100, 50, 20, 10, 5, 2, 1, 0.5, 0.2, or even no greater than 0.1 micrometer). In some embodiments, the second pitch is no more than 50% (in some embodiments, no more than 20%, 10%, 5%, 2%, or even no more than 1%) of the first pitch.

In some embodiments, the article comprises at least one of colorant or pigment. In some embodiments, the article comprises opaque filler. Exemplary colorants and pigments include titanium dioxide, phthalo blue, red iron oxide, various clays, calcium carbonate, mica, silicas, and talcs. Exemplary fillers include glass beads or fibers, carbon black, flock and mineral reinforcements. Colorants, pigments, and/or fillers can be incorporated into the articles described herein, for example, by adding them using conventional techniques into the polymeric material.

In some embodiments, the article includes a metalized layer. Methods of providing a metalized layer over a cured radiation curable resin are well known in the art, and include those methods for making metalized retroreflective sheeting described in U.S. Pat. No. 4,801,193 (Martin).

Any of a variety of patterns of a matrix of first optical elements having at least one discontinuous region of second optical elements can be provided. For example, in some embodiments a discontinuous region may be in any of a variety of geometric shapes such as a circle, oval, square, rectangle, triangle, alphanumeric, etc. In some embodiments, there is a plurality of discontinuous regions of second optical elements within a matrix of first optical elements. In some embodiments, at least a portion of the matrix and at least one discontinuous region (and optionally other discontinuous regions, if present) collectively exhibit at least a first (second, third, or more) image or indicia (which may be, for example, a trademark or copyrighted material, including a registered trademark or registered copyright as defined under any of the countries, territories, etc. of the world (including the United States)). The patterns of the matrix of first optical elements having at least one discontinuous region of second optical elements (optional additional discontinuous regions) are typically created by the arrangement of the tool used to create optical elements in the article and/or the patterned irradiation used in the method for making the article.

Uses of the methods described herein include the production of articles having a product security mark, a logo, a trademark, a decorative appearance, and light management properties (e.g., for transmitted light, reflected light, or retroreflected light).

EMBODIMENTS

Item 1. A method of making an article, the method comprising:
providing a molding tool having a microstructured surface including a plurality of cavities;
at least partially filling the plurality of cavities with a first radiation curable resin;
exposing the first radiation curable resin to a first, patterned irradiation to provide a correspondingly patterned partially cured resin comprising at least one first region and at least one second region, wherein the at least one first region is irradiated by the first, patterned irradiation and the at least one second region is not irradiated by the first, patterned irradiation;
exposing both the at least one first region and the at least one second region to a second irradiation to provide an article having a microstructured surface and a differentially cured pattern therein; and
separating the article having a microstructured surface and a differentially cured pattern therein from the molding tool.

Item 2. The method of item 1, wherein the patterned irradiation comprises at least one of irradiating through transparent regions of a mask, guiding a beam of light, guiding a beam of electrons, or projecting a digital image.

Item 3. The method of item 1, wherein the first radiation curable resin contacts a major surface of an overlay element.

Item 4. The method of item 3, wherein the overlay element comprises a material selected from the group consisting of polymeric film, paper, fabric, fiberglass, nonwovens, glass, and metal foil.

Item 5. The method of item 3, wherein the overlay element is transparent to the radiation used in at least one of the irradiations.

Item 6. The method of item 1, wherein the molding tool is transparent to the radiation used in at least one of the irradiations.

Item 7. The method of item 6, wherein the overlay element is opaque to the patterned irradiation.

Item 8. The method of item 1, further comprising applying a second radiation curable resin over the partially cured resin prior to the second irradiation.

Item 9. The method of item 8, wherein the first and second radiation curable resins each have an index of refraction, and wherein the index of refraction of the first and second radiation curable resins have an absolute difference of less than 0.0002.

Item 10. The method of item 8, wherein the first and second radiation curable resins each have an index of refraction, and wherein the index of refraction of the first and second radiation curable resins have an absolute difference of at least 0.0002.

Item 11. The method of any one of items 8 to 10, wherein the second radiation curable resin contacts a major surface of an overlay element.

Item 12. The method of item 11, wherein the overlay element comprises a material selected from the group consisting of polymeric film, paper, fabric, fiberglass, nonwovens, glass, and metal foil.

Item 13. The method of item 11, wherein the molding tool is transparent to the radiation used in at least one of the irradiations.

Item 14. The method of item 13, wherein the overlay element is opaque to the patterned irradiation.

Item 15. The method of item 1 to 14, wherein there is a plurality of first regions within a matrix of the at least one second region.

Item 16. The method of item 1 to 14, wherein there is a plurality of second regions within a matrix of the at least one first region.

Item 17. A method of making a composite article, the method comprising:
providing a first molding tool having a first microstructured surface including a plurality of cavities;
at least partially filling the plurality of cavities with a radiation curable resin disposed on a first major surface of an overlay element;
exposing the radiation curable resin to a first, patterned irradiation to provide a partially cured composite comprising the overlay element adhered to a correspondingly patterned partially cured resin comprising at least one first region and at least one second region, wherein the at least one first region is irradiated by the first, patterned irradiation and the at least one second region is not irradiated by the first, patterned irradiation;
separating the partially cured composite from the molding tool, such that at least a portion of curable resin from the at least one second region remains in the molding tool, providing the separated partially cured composite with a surface that lacks microstructure in the at least one second region; and
exposing the partially cured composite that was separated from the molding tool to a second irradiation, to provide a composite article having a first microstructured surface and a differentially cured pattern therein.

Item 18. The method of item 17, further comprising providing a second molding tool having a second microstructured surface including a second plurality of cavities;
at least partially filling the second plurality of cavities with a second radiation curable resin disposed on a second major surface of the overlay element of the composite article having a first microstructured surface and a differentially cured pattern therein;
exposing the second radiation curable resin to a third irradiation, to provide an article having the first microstructured surface and the differentially cured pattern therein on the first major surface and a second microstructured surface on the second major surface; and
separating the article from the second molding tool.

Item 19. The method of item 17 or 18, wherein the patterned irradiation comprises at least one of irradiating through transparent regions of a mask, guiding a beam of light, guiding a beam of electrons, or projecting a digital image.

Item 20. The method of item 17 or 18, wherein the overlay element comprises a material selected from the group consisting of polymeric film, paper, fabric, fiberglass, nonwovens, glass, and metal foil.

Item 21. The method of item 17 or 18, wherein the overlay element is transparent to the radiation used in at least one of the irradiations.

Item 22. The method of item 17 or 18, wherein the first molding tool is transparent to the patterned irradiation.

Item 23. The method of item 22, wherein the overlay element is opaque to the patterned irradiation.

Item 24. The method of any one of items 17 to 23, further comprising adding a pigment to at least a portion of the at least one second region prior to exposing the partially cured composite that was separated from the molding tool to a second irradiation.

Item 25. A method of making a composite article, the method comprising:
providing a molding tool having a microstructured surface including a plurality of cavities;
at least partially filling the plurality of cavities with a radiation curable resin disposed on a major surface of an overlay element;
exposing the radiation curable resin to a patterned irradiation to provide a partially cured composite comprising the overlay element adhered to a correspondingly patterned partially cured resin comprising at least one first region and at least one second region, wherein the at least one first region is irradiated by the patterned irradiation and the at least one second region is not irradiated by the patterned irradiation;
separating the partially cured composite from the molding tool; and
removing the radiation curable resin from the at least one second region to provide a composite article having a microstructured surface.

Item 26. The method of item 25, wherein the patterned irradiation comprises at least one of irradiating through transparent regions of a mask, guiding a beam of light, guiding a beam of electrons, or projecting a digital image.

Item 27. The method of item 25, wherein the overlay element comprises a material selected from the group consisting of polymeric film, paper, fabric, fiberglass, nonwovens, glass, and metal foil.

Item 28. The method of item 25, wherein the overlay element is transparent to the patterned irradiation.

Item 29. The method of item 25, wherein the molding tool is transparent to the patterned irradiation.

Item 30. The method of item 29, wherein the overlay element is opaque to the patterned irradiation.

Item 31. A method of making a composite article, the method comprising:

providing a molding tool having a microstructured surface including a plurality of cavities;

at least partially filling the plurality of cavities with a first radiation curable resin;

contacting an overlay element to the first radiation curable resin;

exposing the first radiation curable resin to a patterned irradiation to provide a correspondingly patterned first partially cured resin comprising at least one first region and at least one second region, wherein the at least one first region is irradiated by the first, patterned irradiation and the at least one second region is not irradiated by the first, patterned irradiation;

exposing the first partially cured resin to a first blanket irradiation to provide a first further cured resin, wherein the first further cured resin is adhered to the overlay element;

separating at least a portion of the first further cured resin from the molding tool;

at least partially filling the plurality of cavities with a second radiation curable resin;

contacting the first further cured resin with the second radiation curable resin;

exposing the second radiation curable resin to a second patterned irradiation to provide a correspondingly patterned partially cured resin comprising at least one third region and at least one fourth region, wherein the at least one third region is irradiated by the second, patterned irradiation and the at least one fourth region is not irradiated by the first, patterned irradiation;

exposing the second partially cured resin to a second blanket irradiation to provide a composite article wherein the second further cured resin is adhered to the first further cured resin and the first further cured resin is adhered to the overlay element; and separating the composite article from the molding tool.

Item 32. A method of making a composite article, the method comprising:

providing a molding tool having a microstructured surface including a plurality of cavities;

partially filling the plurality of cavities with a first radiation curable resin;

exposing the first radiation curable resin to a patterned irradiation to provide a correspondingly patterned first partially cured resin comprising at least one first region and at least one second region, wherein the at least one first region is irradiated by the first, patterned irradiation and the at least one second region is not irradiated by the first, patterned irradiation;

exposing the first partially cured resin to a first blanket irradiation to provide a first further cured resin;

contacting a second radiation curable resin to the first further cured resin in the plurality of cavities;

contacting an overlay element to the second radiation curable resin;

exposing the second radiation curable resin to a second patterned irradiation to provide a correspondingly patterned partially cured resin comprising at least one third region and at least one fourth region, wherein the at least one third region is irradiated by the second, patterned irradiation and the at least one fourth region is not irradiated by the first, patterned irradiation;

exposing the second partially cured resin to a second blanket irradiation to provide a composite article wherein the first further cured resin is adhered to the second further cured resin and the second further cured resin is adhered to the overlay element; and separating the composite article from the molding tool.

Advantages and embodiments of this invention are further illustrated by the following examples, but the particular materials and amounts thereof recited in these examples, as well as other conditions and details, should not be construed to unduly limit this invention. All parts and percentages are by weight unless otherwise indicated.

EXAMPLES

Materials

| | |
|---|---|
| ArUA | Aromatic urethane acrylate obtained from Cytec Industries Inc., Smyrna, GA, under the trade designation "EBECRYL 220" |
| AUA | Aliphatic urethane acrylate obtained from Cognis Corporation, Cincinnati, OH, under the trade designation "PHOTOMER 6210" |
| BAED-1 | A bisphenol-A epoxy diacrylate obtained from Cytec Industries Inc. under the trade designation "EBECRYL 3720" |
| BAED-2 | A bisphenol-A epoxy diacrylate obtained from Cytec Industries Inc., under the trade designation "EBECRYL 3701" |
| BEDA | A brominated bisphenol-A epoxy diacrylate obtained from Cytec Industries Inc. under the trade designation "RDX 51027" |
| D1173 | A photoinitiator obtained from Ciba Additives, Houston, TX, under the trade designation "DAROCUR 1173" |
| DEAEMA | Diethylaminoethyl methacrylate, obtained from BASF, Freeport, TX |
| DiPETPA | Dipentaerythritolpentaacrylate, obtained from Sartomer, Exton, PA, under the trade designation "SR 399" |
| HDDA | 1,6-hexanediol diacrylate, obtained from Cytec Industries Inc. |
| I1035 | A stabilizer obtained from Ciba Additives under the trade designation "IRGANOX 1035" |
| I7460 | Co-initiator obtained from Ciba Additives under the trade designation "CGI 7460" |
| I819 | A photoinitiator obtained from Ciba Additives under the trade designation "IRGACURE 819" |
| IBOA | Isobornyl acrylate, obtained from Cytec Industries Inc. |
| MB | Methylene Blue (certified), obtained from Columbia Chemical Inc., Columbia, WI |
| PAU | Polyester aliphatic urethane obtained from Morton International Inc., Seabrook, NH, under the trade designation "PN-04" |
| PEA | Phenoxyethyl acrylate, obtained from Sartomer |
| T405 | A stabilizer obtained from Ciba Additives under the trade designation "TINUVIN 405" |
| TMPTA | Trimethylolpropane triacrylate, obtained from Cytec Industries Inc. |
| TPO | (2,4,6-trimethylbenzoyl) diphenylphosphine oxide, a photoinitiator, obtained from Sigma-Aldrich, St. Louis, MO |

Preparation of Composition 1

A first radiation-curable composition (Composition 1) was prepared by mixing 25 wt. % BAED-1, 12% DEAEMA, 38 wt. % TMPTA, 25 wt. % HDDA, 0.5 part per hundred (pph) TPO, 0.2 pph I1035 and 0.5 pph T405 in a glass jar. About 100 grams of the composition were prepared.

Preparation of Composition 2

A second radiation-curable composition (Composition 2) was prepared by mixing 74.5 wt. % AUA, 24.5 wt. %

HDDA, 1.0 wt. % D1173 and 0.5 pph TPO in a glass jar. About 100 grams of the composition were prepared.

Preparation of Composition 3

A third radiation-curable composition (Composition 3) was prepared by mixing 49.5 wt. % HDDA, 49.5 wt. % TMTPA, and 1 wt. % TPO. About 100 grams of the composition were prepared.

Preparation of Composition 4

A fourth radiation-curable composition (Composition 4) was prepared by mixing 25 wt. % BAED-1, 50 wt. % TMPTA, 25 wt. % HDDA, 0.5 part per hundred (pph) TPO, 0.5 pph D1173 in a glass jar. About 100 grams of the composition were prepared.

Preparation of Composition 5

A fifth radiation-curable composition (Composition 5) was prepared by mixing 74.5 wt. % BAED-1, 24.5 wt. % PEA, 0.5 wt. % D1173, and 0.5 wt. % TPO. About 100 grams of the composition were prepared.

Preparation of Composition 6

A sixth radiation-curable composition (Composition 6) was prepared by mixing 64.7 wt. % BEDA, 24.9 wt. % PEA, TMPTA 9.95 wt. %, 0.35 wt. % D1173, and 0.1 wt. % TPO. About 100 grams of the composition were prepared.

Preparation of Composition 7

A seventh radiation-curable composition (Composition 7) was prepared by mixing 75 wt. % DiPETPA, 25% HDDA, 0.3 part per hundred (pph) MB, 0.4 pph I7460 in an opaque plastic jar. About 100 grams of the composition were prepared and filtered through a 10 micrometer filter prior to use.

Example 1

A retroreflective article was prepared using the following procedure. About 10 grams of Composition 1 were poured onto the upper microstructured face of a heated microstructured tool and then spread uniformly using a 250 micrometer polyester terephthalate (PET) film as a doctor blade. The tool was a nickel plate measuring about 25 cm by 30 cm and 760 micrometers in thickness. The tool had a microstructured surface consisting of cube corner cavities measuring 43 micrometers in depth with a pitch of 86 micrometers. The tool rested on a magnetic hotplate set at 60° C. After filling cavities of the tool with Composition 1 using the doctor blade, a clear 75 micrometer silicone coated PET release liner was laminated to the upper face of the coated tool using an ink roller. A masking film was then placed on top of the release liner. The masking film was a 100 micrometer PET photolithographic printed film having a clear image on a black field which was the negative image of that shown in FIG. 3. A 0.6 cm thick clear glass plate was then placed on top of the mask.

The assembly consisting of the coated tool, release liner, masking film and glass plate was then placed on a conveyor belt and passed under an ultraviolet (UV) lamp to cure the coated composition. In a first curing step, a Fusion "D" UV lamp (obtained from Fusion Systems, Rockville, Md.) set at 600 watt/2.5 cm (100% power setting) was used to irradiate the coated composition. The lamp was positioned 5 cm above the glass plate. The conveyor belt operated at 15.2 meters/min.

Following the UV exposure, the glass plate, masking film and release liner were removed from the coated tool. An additional 10 grams of Composition 1 were then poured and spread uniformly onto the tool. An overlay film (light transmissive support layer) was then laminated to the coated tool using an ink roller. The overlay film was a clear 50 micrometer PET film coated with 75 micrometers of PAU. The polyurethane coated side of the overlay film was in contact with the coated tool. The assembly consisting of the coated tool and overlay film was then placed on a conveyor belt and passed under an UV lamp to cure the coated composition using the same conditions as above for the first curing step. The cured composition/film was then removed from the tool and again passed under a UV lamp with the microstructures facing the UV lamp to complete the curing using the same conditions as above for the first and second curing steps.

FIG. 3 is a digital photographic image of the resulting retroreflective article ($M_1$ was about 58 millimeters).

Example 2

A retroreflective article was prepared using the following procedure. About 10 grams of Composition 1 were poured onto the upper microstructured face of a heated microstructured tool and then spread uniformly using a 250 micrometer PET film as a doctor blade. The tool was a nickel plate measuring about 25 cm by 30 cm and 760 micrometers in thickness. The tool had a microstructured surface consisting of cube corner cavities measuring 89 micrometers in depth with a pitch of 178 micrometers. The tool rested on a magnetic hotplate set at 60° C. After filling cavities of the tool with Composition 1 using the doctor blade, a clear 50 micrometer PET overlay film coated with 75 micrometers of PAU was laminated to the upper face of the coated tool using an ink roller. A masking film was then placed on top of the overlay film. The masking film was a 50 micrometer PET photolithographic printed film having a clear image on a black field, as shown in FIG. 6A ($M_2$ was about 26 millimeters). A 0.6 cm thick clear glass plate was then placed on top of the mask. An array of light emitting diodes (LEDs) was then placed on top of the assembly consisting of the coated tool, overlay film, masking film, and glass plate. The array consisted of two rows of 36 LEDs each (395 nm wavelength, obtained from Clearstone Technologies, Minneapolis, Minn., under the trade designation "CF 1000"), for a total of 72 LEDs arranged in a 3 cm by 38 cm frame. The LED array was manually passed back and forth twice over the glass plate at about 6 meters/min to cure the coated composition.

Following the LED exposure, the glass plate and masking film were removed from the coated tool. The assembly consisting of the coated tool and overlay film was then placed on a conveyor belt and passed under a Fusion "H" UV lamp (obtained from Fusion Systems) set at 600 watt/2.5 cm (100% power setting) to provide additional cure to the coated composition. The lamp was positioned 5 cm above the glass plate. The conveyor belt operated at 15.2 meters/min. The cured composition/film was then removed from the tool, placed on a conveyor belt and again passed under a Fusion "H" UV lamp (Fusion Systems) set at 600 watt/2.5 cm (100% power setting) with the microstructures facing the UV lamp to provide additional cure to the coated composition.

FIG. 6B is a digital photographic image of the resulting retroreflective article ($M_3$ was about 26 millimeters).

Example 3

A prismatic article was prepared using the following procedure. About 5 grams of Composition 2 were poured onto the upper microstructured face of a heated microstructured tool and then spread uniformly using a 250 micrometer PET film as a doctor blade. The tool was a nickel plate measuring about 25 cm by 30 cm and 760 micrometers in thickness. The tool had a microstructured surface consisting of 90° prismatic grooves measuring 25 micrometers in depth with a pitch of 50 micrometers. The tool rested on a magnetic hotplate set at 63° C. After filling grooves of the tool with Composition 2 using the doctor blade, a clear overlay film (light transmissive support layer) was laminated to the coated tool using an ink roller. The overlay film was a clear 125 micrometer primed PET film (obtained from DuPont Teijin Films, Chester, Va., under the trade designation "DUPONT-TEIJIN #617"). A masking film was then placed on top of the overlay film. The masking film was a 100 micrometer PET photolithographic printed film having a clear image on a black field, as shown in FIG. 6A. A 0.6 cm thick clear glass plate was then placed on top of the mask. An array of LEDs was then placed on top of the assembly consisting of the coated tool, overlay film, masking film and glass plate. The array consisted of two rows of 36 LEDs each ("CF 1000") for a total of 72 LEDs arranged in a 3 cm by 38 cm frame. The LED array was manually passed back and forth twice over the glass plate at about 6 meters/min to cure the coated composition.

Following the LED exposure, the glass plate and masking film were removed from the coated tool. The assembly consisting of the coated tool and overlay film was then placed on a conveyor belt and passed under an electron beam in an electron beam system (obtained from Energy Sciences Inc., Wilmington, Mass., under the trade designation "MODEL CB-300 ELECTRON BEAM SYSTEM") operating at 200 kV voltage to deliver a dose of 5 megarads to provide additional cure to the coated composition. The conveyor belt operated at 7.9 meters/min.

FIG. 7 is a digital photographic image of the resulting retroreflective article ($M_4$ was about 26 millimeters).

Example 4

A prismatic article was prepared as described in Example 3 above with the following exceptions. The mask was a 1.6 mm aluminum die cut sheet shown in FIG. 8A ($M_5$ was about 6.2 millimeters). The assembly consisting of the coated tool, the overlay film and the mask was then placed on a conveyor belt and passed under an electron beam in an electron beam system ("MODEL CB-300 ELECTRON BEAM SYSTEM") operating at 200 kV voltage delivering a dose of 2 megarads to cure the coated composition. The conveyor belt operated at 7.9 meters/min. The mask was then removed and the assembly consisting of the coated tool and overlay film was then placed on a conveyor belt and passed under the electron beam operating at 200 kV voltage delivering a dose of 5 megarads to provide additional cure to the coated composition.

FIG. 8B is a digital photographic image of the resulting prismatic article ($M_6$ was about 15 millimeters).

Example 5

A prismatic article was prepared using the following procedure. A polyester film mask was adhered to one side of a 75 micrometer, 38 cm wide strip (about 1.2-1.5 meters long) primed PET overlay film ("DUPONT-TEIJIN #617") using removable adhesive tape (obtained from 3M Company, St. Paul, Minn., under the trade designation "SCOTCH #811"), forming a two-layer laminate. The film mask was a 20 cm by 25 cm sheets of a 100 micrometer PET photolithographic printed film having a clear image on a black field which was the negative image of that shown in FIG. 10.

The two-layer laminate was then taped onto a 53 cm wide 75 micrometer PET film serving as a carrier layer, using adhesive tape (obtained from 3M Company under the trade designation "SCOTCH BOX SEALING TAPE") to form a three-layer laminate consisting of the overlay film, having one major surface of the mask against the overlay film, and the other major surface of the mask against the carrier layer. An excess of resin Composition 2 was then coated onto the overlay film using a conventional coating die such that a rolling bank of material was formed between a rubber coated nip roll and a rotary metal tool. The rotary metal tool had a microstructured surface consisting of 90° prismatic grooves measuring 25 micrometers in depth with a pitch of 50 micrometers.

The coated three-layer laminate was nipped against the rotary metal tool, which had a temperature of 54° C. and operated at a line speed of 12 meters/min. The coated three-layer laminate was then initially cured by irradiating from the carrier layer side using a Fusion "D" UV lamp (Fusion Systems) set at 600 watts/2.5 cm (100% power setting) and positioned about 5 cm from the tool, thereby irradiating the resin of Composition 2 through the clear portion of the mask. The coated three-layer laminate was then removed from the rotary metal tool and conveyed into an inert nitrogen atmosphere UV curing chamber equipped with a UV lamp (obtained from Aetek UV Systems, Lebanon, Ind., under the trade designation "UVXL20") set at 400 watt/2.5 cm (100% power setting) to provide additional cure. The lamp was positioned about 5 cm from the laminate, with the resin of Composition 2 facing the lamp.

FIG. 10 is a digital photographic image of the resulting prismatic article ($M_7$ was about 12 millimeters).

Example 6

A pair of prismatic articles was prepared using the same procedure as in Example 5, except that a pair of masks was used (side by side) that were the negative of left half 1101 and right half 1102 of the image in FIG. 11, respectively. FIG. 11 is a digital photographic image of the resulting pair of prismatic articles ($M_8$ and $M_9$ were each about 26 millimeters).

Example 7

A microlens article was prepared using the following procedure. A film mask was adhered to one side of a 75 micrometer, 38 cm wide strip (about 1.2-1.5 meters long) primed PET overlay film ("DUPONT-TEIJIN #617") using removable adhesive tape ("SCOTCH #811"), forming a two-layer laminate. The film mask was a 20 cm by 25 cm sheet of a 100 micrometer PET photolithographic printed film having a clear image on a black field which corresponded to the at least one first region 1231 and at least one second region 1234 of FIG. 12, respectively. The two-layer laminate was then taped onto a 53 cm wide 75 micrometer PET film serving as a carrier layer, using adhesive tape ("SCOTCH BOX SEALING TAPE") to form a three-layer laminate consisting of the overlay film, having one major surface of the mask against the overlay film, and having the other major surface of the mask against the carrier layer. An excess of resin Composition 2 was then coated onto the overlay film using a conventional coating die such that a rolling bank of material was formed between a rubber coated nip roll and a rotary metal tool. The rotary metal tool had a microlens microstructured surface consisting of circular depressions having a diameter of 40 micrometers and a depth of 10.8 micrometers.

The coated three-layer laminate was nipped against the rotary metal tool, which had a temperature of 54° C. and operated at a line speed of 12 meters/min. The coated three-layer laminate was then irradiated from the carrier layer side using a Fusion "D" UV lamp (Fusion Systems) set at 600 watts/2.5 cm (100% power setting) and positioned about 5 cm from the tool, thereby irradiating the resin of Composition 2 through the clear portion of the mask and forming a composite of the overlay film and cured resin. The coated three-layer laminate was then removed from the rotary metal tool, and any remaining uncured resin that had been protected by the black region of the mask was removed by hand-spraying the uncured resin away from the composite film with 2-propanol, followed by air drying.

FIG. 12 is a digital photographic image of the resulting microlens article ($M_{10}$ was about 19 millimeters).

Example 8

A microlens article was prepared using the following procedure. A film mask was adhered to one side of a 75 micrometer, 38 cm wide strip (about 1.2-1.5 meters long) primed PET overlay film ("DUPONT-TEIJIN #617") using removable adhesive tape ("SCOTCH #811"), forming a two-layer laminate. The film mask was a 20 cm by 25 cm sheet of a 100 micrometer PET photolithographic printed film having a clear image on a black field which corresponded to the at least one first region 1331 and at least one second region 1334 of FIG. 13, respectively. The two-layer laminate was then taped onto a 53 cm wide 75 micrometer PET film serving as a carrier layer, using adhesive tape ("SCOTCH BOX SEALING TAPE") to form a three-layer laminate consisting of the overlay film, having one major surface of the mask against the overlay film, and having the other major surface of the mask against the carrier layer. An excess of resin Composition 2 was then coated onto the overlay film using a conventional coating die such that a rolling bank of material was formed between a rubber coated nip roll and a rotary metal tool. The rotary metal tool had a microlens microstructured surface consisting of circular depressions having a diameter of 40 micrometers and a depth of 10.8 micrometers.

The coated three-layer laminate was nipped against the rotary metal tool, which had a temperature of 54° C. and operated at a line speed of 12 meters/min. The coated three-layer laminate was then irradiated from the carrier layer side using a Fusion "D" UV lamp (Fusion Systems) set at 600 watts/2.5 cm (100% power setting) and positioned about 5 cm from the tool, thereby irradiating the resin of Composition 2 through the clear portion of the mask and forming a composite of the overlay film and cured resin. The coated three-layer laminate and masks were then removed from the tool and conveyed into an inert nitrogen atmosphere UV curing chamber equipped with a UV lamp ("UVXL20") set at 400 watt/2.5 cm (100% power setting) to provide additional cure. The lamp was positioned about 5 cm from the laminate, and irradiated the resin side of the coated three-layer laminate.

The composite of overlay film and cured resin was separated from the mask and carrier layer, and positioned with non-replicated smooth side of the overlay film facing up. An excess of Composition 2 was then coated onto the non-replicated smooth side of the overlay film, and the coated overlay film was then nipped against the rotary metal tool having a microstructured surface consisting of circular depressions having a diameter of 40 micrometers and a depth of 10.8 micrometers, producing a coated laminate. The tool temperature was 54° C., and operated at a line speed of 12 meters/min. The coated laminate was then initially cured while in contact with the tool using a Fusion "D" UV lamp (Fusion Systems) set at 600 watt/2.5 cm (100% power setting). The lamp was positioned about 5 cm above the tool. The coated laminate was then removed from the tool and conveyed into an inert nitrogen atmosphere UV curing chamber equipped with a UV lamp ("UVXL20") set at 400 watt/2.5 cm (100% power setting) to provide additional cure. The lamp was positioned about 5 cm from the laminate.

FIG. 13 is a digital photographic image of the resulting microlens article ($M_{11}$ was about 31 millimeters). Varying degrees of Moiré interference are evident in FIG. 13.

Example 9

A retroreflective article was prepared using the following procedure. About 10 grams of Composition 2 were poured onto the upper microstructured face of a heated microstructured tool and then spread uniformly using a 250 PET film as a doctor blade. The tool was a nickel plate measuring about 25 cm by 30 cm and 760 micrometers in thickness. The tool had a microstructured surface consisting of cube corner cavities measuring 43 micrometers in depth with a pitch of 86 micrometers. The tool rested on a magnetic hotplate set at 60° C. After filling cavities of the tool with Composition 2 using the doctor blade, an overlay film (light transmissive support layer) was then laminated to the coated tool using an ink roller. The overlay film was a clear 75 micrometer primed PET film ("DUPONT-TEIJIN #617"). A masking film was then placed on top of the overlay film. The masking film was a 75 micrometer PET photolithographic printed film having a clear image on a black field which was the negative image of that shown in FIG. 14A. A 0.6 cm thick clear glass plate was then placed on top of the mask. The assembly consisting of the coated tool, overlay film, masking film and glass plate was then placed on a conveyor belt and passed under an UV lamp to irradiate the coated composition. A Fusion "D" UV lamp (Fusion Systems) set at 600 watt/2.5 cm (100% power setting) was used to irradiate the coated composition. The lamp was positioned 5 cm above the glass plate. The conveyor belt operated at 15.2 meters/min. Following the UV exposure, the glass plate, masking film, overlay film and cured composition/film were removed from the coated tool.

A fluorescent yellow pigment (obtained from DayGlo Color Corp., Cleveland, Ohio, under the trade designation "DAY-GLO ZQ-17 SATURN YELLOW") was sprinkled by hand over non-irradiated, uncured regions of the coated composition that had been covered/protected by opaque regions the masking film. Excess pigment that was not adhered to the uncured regions was removed by shaking. The assembly consisting of the coated composition and overlay film was then placed with the microstructures facing the UV lamp on a conveyor belt and passed in a nitrogen atmosphere under a Fusion "D" UV lamp (Fusion Systems) to cure the uncured regions of the coated composition using the same conditions as above for the first curing step. The assembly consisting of the coated composition and overlay film was then inverted and again passed under the UV lamp with the microstructures facing away from the UV lamp to complete the curing, using the same conditions as above for the first and second curing steps. Non-adhered residual pigment was then washed off using deionized water containing a few drops of detergent (obtained from Alconox, Inc., White Plains, N.Y., under the trade designation "LIQUI-NOX"). The microstructured film was then rinsed with deionized water and then rinsed with ethanol.

FIGS. 14A and 14B are images of the resulting retroreflective article, taken under normal lighting and retroreflective lighting conditions, respectively ($M_{12}$ and $M_{13}$ were each about 31 millimeters).

Example 10

A polymeric film tool was prepared using the following procedure. Resin Composition 2 was coated onto a 125 micrometer primed PET overlay film ("DUPONT-TEIJIN #617") using a conventional coating die. An excess of Composition 2 was provided to the nip such that a rolling bank of material was formed. The coated PET film was then nipped against rotary metal tool having a microstructured surface consisting of cube corners measuring 89 micrometers in height with a pitch of 178 micrometers. The tool temperature was 54° C., and operated at a line speed of 7.6 meters/min. The coated PET film was then initially cured while in contact with the rotary metal tool using a Fusion "D" UV lamp (Fusion Systems) set at 600 watt/2.5 cm (100% power setting) and positioned about 5 cm from the tool. The coated PET film was then removed from the rotary metal tool and conveyed into a UV curing chamber equipped with a Fusion "D" UV lamp (Fusion Systems) set at 600 watt/2.5 cm (100% power setting) to provide additional cure. The cured microstructured composition/PET film laminate (polymeric tool) was then plasma treated with tetramethylsilane using the following procedure to provide a release coating on the microstructured side of the polymeric tool.

The release coating was applied by depositing a silicon containing film by plasma deposition. The deposition was carried out in a commercial reactive ion etcher system (obtained from Plasmatherm, Kresson, N.J., under the trade designation "PLASMATHERM MODEL 3032") configured for reactive ion etching (RIE) with a 26-inch (66 cm) lower powered electrode and central gas pumping. The chamber was pumped by a roots blower (obtained from Edwards Vacuum, Ltd., Tewksbury, Mass., under the trade designation "EDWARDS MODEL EH1200") backed by a dry mechanical pump (obtained from Edwards Vacuum, Ltd. under the trade designation "EDWARDS MODEL iQDP80"). RF power was delivered by a 5 kW, 13.56 MHz solid-state generator ("RFPP MODEL RF50S0") through an impedance matching network. The system had a nominal base pressure of 5 mTorr. The flow rates of the gases were controlled by flow controllers (obtained from MKS Instruments, Andover, Mass.). Samples of the polymeric tools were placed on the powered electrode of the batch plasma apparatus. The plasma treatment was done in a series of treatment steps. The features were first treated with an oxygen plasma by flowing oxygen gas at a flow rate of 500 $cm^3$/min and plasma power of 200 watts for 60 seconds. After the oxygen plasma treatment, a silicon containing film was then deposited by flowing tetramethylsilane (TMS) gas at a flow rate of 150 standard $cm^3$/min, plasma power of 200 watts for 120 seconds. After the plasma deposition was completed, the chamber was vented to atmosphere and the polymeric tools were removed and subsequently used as the tool(s) in the following procedure.

A retroreflective article was then prepared using the above described release coated polymeric tool and the following procedure. An assembly was prepared by laying a photolithographic film mask onto a 0.6 cm thick clear glass plate. The masking film was a 100 micrometer PET photolithographic printed film having a clear image on a black field which was the negative image of that shown in FIG. 16A ($M_{14}$ was about 26 millimeters). The polymeric tool was laid on top of the mask with the cube corner cavities facing upward. About 10 grams of Composition 1 were poured onto the upper microstructured face of the polymeric tool and then spread uniformly using a 250 micrometer PET film as a doctor blade. The glass rested on a hotplate which was set at 66° C. After filling cavities of the tool with Composition 1 using the doctor blade, a clear 50 micrometer PET overlay film coated with 75 micrometers of PAU was laminated to the upper face of the coated tool using an ink roller. A 0.6 cm thick clear glass plate was then placed on top of the overlay film. The assembly consisting of the coated tool, mask, carrier film and glass plates was then inverted and placed on a conveyor belt and passed under an UV lamp to cure the coated composition through the mask. A Fusion "H" UV lamp (Fusion Systems) set at 600 watt/2.5 cm (100% power setting) was used to cure the coated composition. The lamp was positioned 5 cm above the glass plate. The conveyor belt operated at 15.2 meters/min. The assembly was then inverted and placed on the conveyor belt a second time and cured using the same procedure to provide additional cure.

Figure 16B:
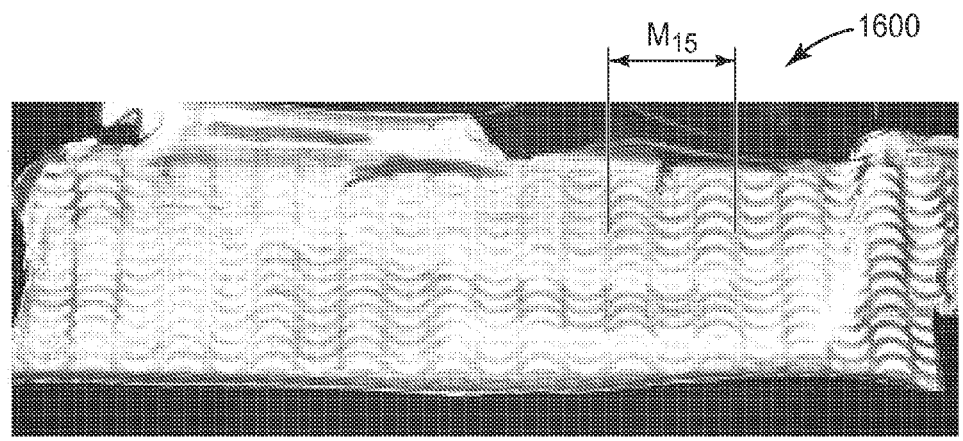

FIG. 16B is a digital photographic image of the resulting retroreflective article ($M_{15}$ was about 26 millimeters).

Example 11

A prismatic article was prepared using the following procedure. Resin Composition 2 was coated onto rotary metal tool using a conventional coating die as generally shown in FIG. 17. The die was positioned to provide Composition 2 between the rotary metal tool roll and a rubber coated nip roll. The rotary metal tool had a microstructured surface consisting of 90° prismatic grooves measuring 25 micrometers in depth with a pitch of 50 micrometers. The tool temperature was 57° C., and operated at a line speed of 7.6 meters/min. A portion of the Composition 2 was then crosslinked while in contact with the rotary metal tool by irradiation with a UV laser ("AVIA 355-1500") having a repetition rate of 10 kiloHertz (kHz), with a mirror positioned at a distance of about 60 millimeters from the tool surface and a mirror scan rate of about 32 millimeters per second. The mirror was oscillated to generate sinusoidal pattern of irradiation.

Resin Composition 2 was coated onto a 75 micrometer primed PET film ("DUPONT-TEIJIN #617") using a conventional coating die as generally shown in FIG. 17. An excess of Composition 2 was provided such that a rolling bank of material was formed. The coated PET film was then nipped against the rotary metal tool. The coated rotary metal was then cured using a Fusion "D" UV lamp (Fusion Systems) set at 600 watt/2.5 cm (100% power setting) and positioned about 5 cm above the tool. The cured Composition 2 and PET film were removed from the rotary metal tool and then conveyed into a UV curing chamber equipped with a Fusion "D" lamp (Fusion Systems) set at 600 watt/2.5 cm (100% power setting) to provide additional cure. The lamp was positioned about 5 cm above the laminate.

FIG. 18 is a digital photographic image of the resulting prismatic article ($M_{16}$ was about 2 millimeters).

Example 12

A prismatic article was prepared using the following procedure. Resin Composition 3 was coated onto a rotary metal tool using a conventional coating die as generally shown in FIG. 17. The die was positioned to provide Composition 3 between the rotary metal tool roll and a rubber coated nip roll. The rotary metal tool had a microstructured surface consisting of 90° prismatic grooves measuring 25 micrometers in depth with a pitch of 50 micrometers. The tool temperature was 57° C., and operated at a line speed of 23 meters/min. A portion of coated Composition 3 was then crosslinked while in contact with the rotary metal tool by irradiation with a UV laser ("AVIA 355-1500") having a repetition rate of 7.5 kiloHertz (kHz), with a mirror positioned at a distance of about 60 millimeters from the tool surface and a mirror scan rate of about 272 millimeters per second. The mirror was oscillated to generate sinusoidal pattern of irradiation.

Resin Composition 2 was coated onto a 75 micrometer primed PET film ("DUPONT-TEIJIN #617") using a conventional coating die as generally shown in FIG. 17. An excess of Composition 2 was provided such that a rolling bank of material was formed. The coated PET film was then nipped against the coated rotary metal tool, forming a composite that included the brightness enhancement film, the coating of Composition 3 having a crosslinked portion, the coating of Composition 2, and the primed PET film, and this composite was then cured using a Fusion "D" UV lamp (Fusion Systems) set at 600 watt/2.5 cm (100% power setting) and positioned about 5 cm above the rotary metal tool. The cured Composition 2 and PET film were removed from the rotary metal tool and then conveyed into a UV curing chamber equipped with a Fusion "D" lamp (Fusion Systems) set at 600 watt/2.5 cm (100% power setting) to provide additional cure. The lamp was positioned about 5 cm above the laminate.

FIG. 19 is a digital photographic image of the resulting prismatic article ($M_{17}$ was about 75 millimeters).

Example 13

A prismatic article was prepared using the following procedure. Resin Composition 2 was coated onto a 75 micrometer primed PET film ("DUPONT-TEIJIN #617") using a conventional coating die, and the coated film was nipped against a rotary metal tool using a rubber coated nip roll, as generally shown in FIG. 20. The rotary metal tool had a microstructured surface consisting of 90° prismatic grooves measuring 25 micrometers in depth with a pitch of 50 micrometers. The tool temperature was 57° C., and operated at a line speed of 7.6 meters/min. A portion of coated Composition 2 was then crosslinked while in contact with the rotary metal tool by irradiating through the overlay film with a UV laser ("AVIA 355-1500") having a repetition rate of 7.5 kiloHertz (kHz), with a mirror positioned at a distance of about 60 millimeters from the tool surface and a mirror scan rate of about 272 millimeters per second, giving a partially cured resin. The mirror was oscillated to generate sinusoidal pattern of irradiation. The partially cured resin was then cured using a Fusion "D" UV lamp (Fusion Systems) set at 600 watt/2.5 cm (100% power setting) and positioned about 5 cm above the rotary metal tool. The cured Composition 2 and PET film were removed from the rotary metal tool and then conveyed into an inert nitrogen atmosphere UV curing chamber equipped with a Fusion "D" lamp (Fusion Systems) set at 600 watt/2.5 cm (100% power setting) to provide additional cure. The lamp was positioned about 5 cm above the laminate.

FIG. 21 is a digital photographic image of the resulting prismatic article ($M_{18}$ was about 75 millimeters).

Example 14

A retroreflective article was prepared using the following procedure. About 10 grams of Composition 4 were poured onto the upper microstructured face of a heated microstructured tool and then spread uniformly using a 250 micrometer PET film as a doctor blade. The tool was a nickel plate measuring about 25 cm by 30 cm and 760 micrometers in thickness. The tool had a microstructured surface consisting of cube corner cavities measuring 89 micrometers in depth with a pitch of 178 micrometers. The tool rested on a magnetic hotplate set at 63° C. After filling cavities of the tool with Composition 4 using the doctor blade, a sheet of nylon fabric (obtained from Jo-Ann Fabrics, Hudson, Ohio, under the trade designation "BRIDAL INSPIRATIONS TULLE, WHITE ORGANZA #664-7242") approximately 13 cm×20 cm was placed on the coated tool. Another 5 grams of Composition 4 was applied to the tool and a sheet of 125 micrometer clear PET was laminated to upper face of the coated tool and fabric using an ink roller. A masking film was then placed on top of the PET film. The masking film was a 100 micrometer PET photolithographic printed film having a clear image on a black field. A 0.6 cm thick clear glass plate was then placed on top of the mask. The assembly consisting of the coated tool, nylon fabric, PET film, masking film and glass plate was then placed on a conveyor belt and passed under a Fusion "D" UV lamp (Fusion Systems) set at 600 watt/2.5 cm (100% power setting) to irradiate the coated composition. The lamp was positioned 5 cm above the glass plate. The conveyor belt operated at 10.7 meters/min. Following the UV exposure, the glass plate, masking film and PET film and coated fabric were removed from the coated tool. Any remaining uncured resin that had been protected with the mask was removed from the fabric by hand-spraying with 2-propanol, followed by air drying.

FIG. 22A is a digital photographic image of the resulting retroreflective article ($M_{27}$ is about 39 millimeters) in ambient light. FIG. 22B is a digital photographic image of the resulting retroreflective article in retroreflection.

Example 15

A prismatic article was prepared using the following procedure. About 30 grams of Composition 2 were poured onto the upper microstructured face of a heated microstructured tool and then spread uniformly using a 250 micrometer PET film as a doctor blade. The microstructured tool was a nickel plate measuring about 25 cm by 30 cm and 760 micrometers in thickness. The metal microstructured tool had a microstructured surface consisting of 90 degree prismatic grooves measuring 175 micrometers in depth with a pitch of 350 micrometers. The metal microstructured tool rested on a magnetic hotplate set at 66° C. After filling cavities of the tool with Composition 2 using the doctor blade, a clear 125 micrometer primed PET overlay film ("DUPONT TEIJIN #617"; 2330 in FIG. 23) was laminated to the upper face of the coated tool using an ink roller. A first masking film was then placed on top of the overlay film. The first masking film was a 100 micrometer PET photolithographic printed film having a clear image on a black field, having a pattern corresponding to "crescents" 2436 in FIG. 24. A 0.6 cm thick clear glass plate was then placed on top of the mask. The assembly consisting of the coated tool, overlay film, and the glass plate was then placed on a conveyor belt and passed under a Fusion "D" UV lamp (Fusion Systems) set at 600 watt/2.54 cm (100% power setting) to cure to the coated composition. The lamp was positioned 5 cm above the glass plate. The conveyor belt operated at 15.2 meters/min. Following the UV exposure, the glass plate and the first masking film were removed from the coated tool. The assembly consisting of the coated tool and overlay film was then placed on a conveyor belt and passed under a Fusion "D" UV lamp set at 600 watt/2.54 cm (100% power setting) to provide additional cure to the coated composition, resulting in a cured composition/film on the microstructured tool.

The microstructured tool was placed on the heated magnetic hotplate. The cured composition/film was then partially removed from the microstructured tool, leaving about 5 cm of a leading edge of the composition/film in the tool to keep the microstructures (2335 in FIG. 23) of the composition/film in registration with the prismatic grooves in the microstructured surface of the tool. About 5 grams of Composition 5 were poured between the tool and the composition/film. An ink roller was used to spread Composition 5 between the tool and the microstructures formed by Composition 1. A second masking film was then placed on top of the overlay film. The second masking film was a 100 micrometer PET photolithographic printed film having a clear image on a black field, having a pattern corresponding to the "smiles" 2431 in FIG. 24. A 0.6 cm thick clear glass plate was then placed on top of the second making film. The assembly consisting of the coated tool, overlay film, second masking film, and the glass plate was then placed on a conveyor belt and passed under a Fusion "D" UV lamp (Fusion Systems) set at 600 watt/2.54 cm (100% power setting) to cure to the coated composition. The lamp was positioned 5 cm above the glass plate. The conveyor belt operated at 15.2 meters/min. Following the UV exposure, the glass plate and the second masking film were removed from the coated tool. The assembly consisting of the coated tool and overlay film was then placed on a conveyor belt and passed under a Fusion "D" UV lamp (Fusion Systems) set at 600 watt/2.54 cm (100% power setting) to provide additional cure to the coated composition.

Figure 24:
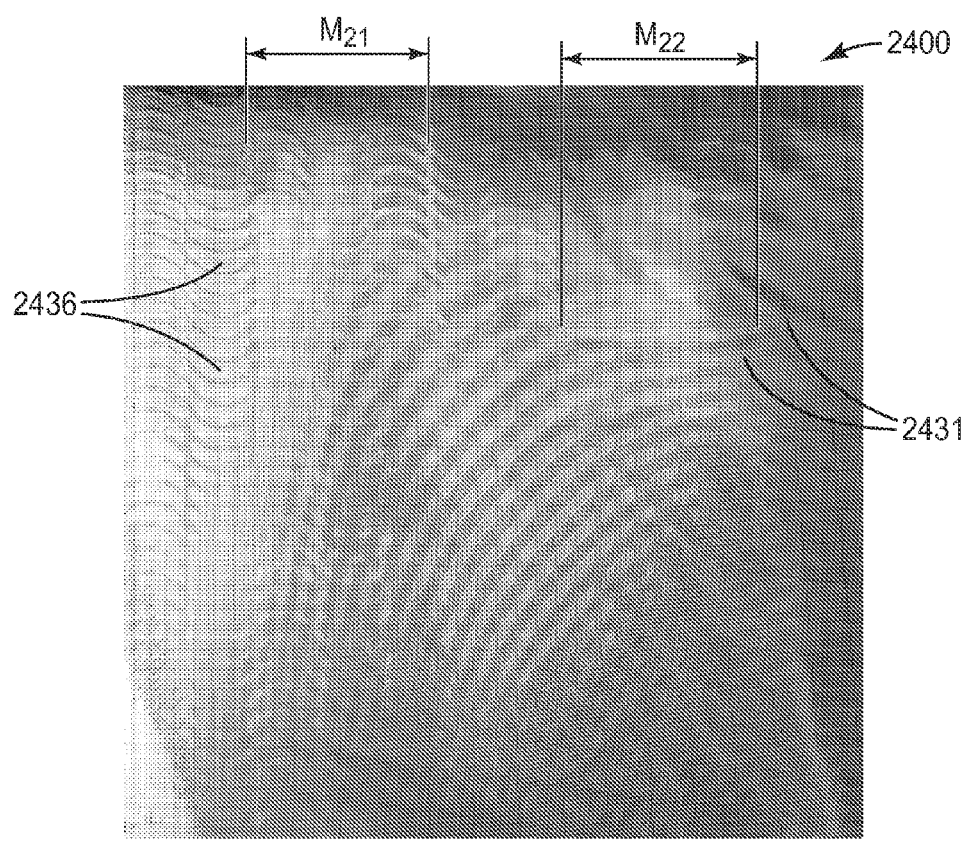
FIG. 24 is a digital photographic image of an exemplary differentially pattern cured microstructured article described herein.

FIG. 23 is a microscopic cross-sectional image of the resulting prismatic article ($M_{20}$ is about 350 micrometers). FIG. 24 is a digital photographic image of the resulting prismatic article in ambient light ($M_{21}$ is about 26 millimeters, and $M_{22}$ is about 31 millimeters).

Example 16

A prismatic article was prepared using the following procedure. About 15 grams of a solution of 25 wt. % Composition 2 in ethanol were applied as a bead along the leading edge onto the upper microstructured face of a microstructured tool at about 24° C., and then spread uniformly using a 250 micrometer PET film as a doctor blade. The tool was a nickel plate measuring about 25 cm by 30 cm and 760 micrometers in thickness. The metal microstructured tool had a microstructured surface consisting of 90 degree prismatic grooves measuring 175 micrometers in depth with a pitch of 350 micrometers. The coated tool was placed onto heated on a magnetic hotplate set at 63° C. to evaporate the ethanol. After about 2 minutes, a silicone coated PET release liner was placed on the coated tool. A masking film was then placed on top of the PET release film. The masking film was a 100 micrometer PET photolithographic printed film having a clear image on a black field. A 0.6 cm thick clear glass plate was then placed on top of the mask. The assembly consisting of the coated tool, PET release film, masking film and glass plate was then placed on a conveyor belt and passed under an ultraviolet (UV) lamp to cure the coated composition. In the curing step, a Fusion "D" UV lamp (Fusion Systems) set at 600 watt/2.54 cm (100% power setting) was used to irradiate the coated composition. The lamp was positioned 5 cm above the glass plate. The conveyor belt operated at 15.2 meters/min.

Following the UV exposure, the glass plate, masking film and PET release film were removed from the coated tool. The coated tool was placed back onto the conveyor and passed under the UV lamp as describe above. About 15 grams of Composition 6 was applied to the tool and a sheet of 125 micrometer clear PET ("DUPONT TEIJIN #617"; 2520 in FIG. 25A) was laminated to upper face of the coated tool using an ink roller. A second masking film was then placed on top of the PET film. The masking film was a 100 micrometer PET photolithographic printed film having a clear image on a black field. A 0.6 cm thick clear glass plate was then placed on top of the mask. The assembly consisting of the coated tool, PET film, masking film and glass plate was then placed on a conveyor belt and passed under an ultraviolet (UV) lamp to cure the coated composition. In the curing step, a Fusion "D" UV lamp (Fusion Systems) set at 600 watt/2.54 cm (100% power setting) was used to irradiate the coated composition. The lamp was positioned 5 cm above the glass plate. The conveyor belt operated at 15.2 meters/min. Following the UV exposure, the glass plate and masking film were removed from the coated tool. The coated tool with the film/resin composition was placed onto the conveyor and passed under the UV lamp as describe above. After the curing step, the film/resin composition was removed from the tool.

Figure 25B:
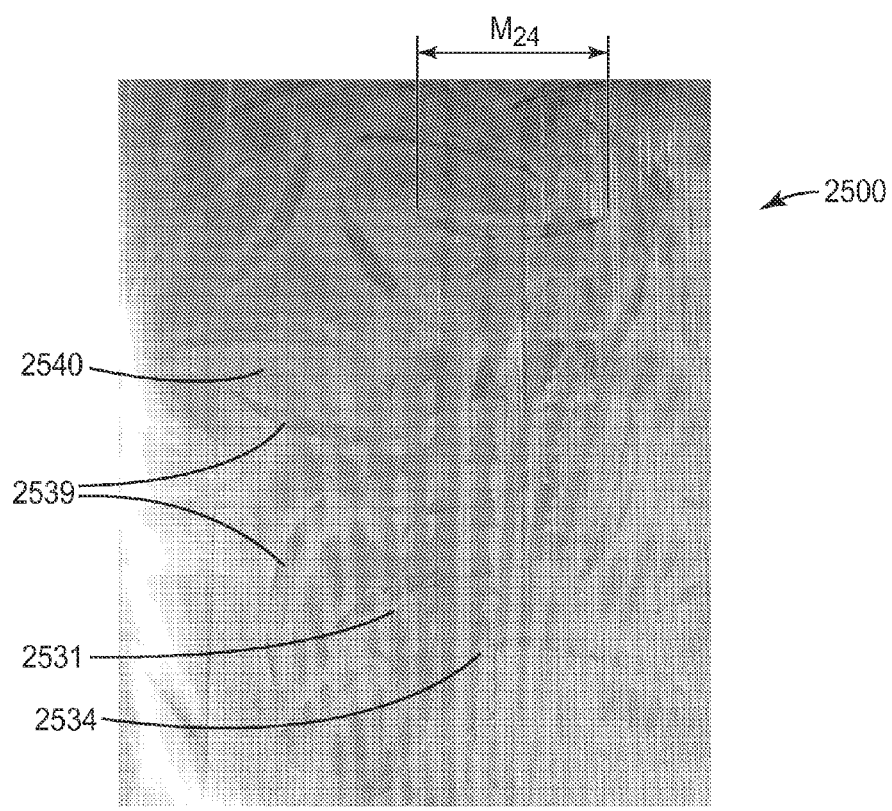
FIG. 25B is digital photographic image of the same exemplary differentially pattern cured microstructured article described herein.

FIG. 25A is a microscopic cross-sectional image of the resulting prismatic article ($M_{23}$ is about 350 micrometers). FIG. 25B is a digital photographic image of the resulting prismatic article in ambient light ($M_{24}$ is about 39 millimeters).

Example 17

A prismatic article was prepared using the following procedure. About 5 grams of Composition 2 were poured onto the upper face of a heated 35 micrometer thick 11.4 cm×16.5 sheet of copper foil (obtained from High Performance Copper Foil, Inc., Chandler, Ariz., under the trade designation "JTC GRADE 1 COPPER FOIL") resting on a sheet of 1/16 inch (1.6 mm) thick aluminum heated to 60° C. The resin was then spread uniformly using a 250 micrometer PET film as a doctor blade. After coating the copper foil, a plasma tetramethylsilane (TMS) release treated grooved film tool (obtained from 3M Company under the trade designation "THIN BRIGHTNESS ENHANCING FILM II (90/24)") was laminated to the resin using an ink roller to minimize the resin thickness. A mask was placed on top of the grooved film tool, and a 6.4 millimeter sheet of window glass was placed on the mask to ensure intimate contact of the copper foil, resin, grooved film tool, and mask. The masking film was a 100 micrometer PET photolithographic printed film having a clear image on a black field. The assembly consisting of the coated copper foil, film tool and mask was then placed on a conveyor belt and passed under a Fusion "D" UV lamp (Fusion Systems) set at 600 watt/2.54 cm (100% power setting) to cure to the coated composition. The lamp was positioned 5 cm from the glass plate. The conveyor belt operated at 15.2 meters/min. Following the UV exposure, the glass plate, film tool and mask were removed from the coated copper foil, and uncured resin was rinsed from the copper foil using ethanol and air dried, giving a patterned metal/resin composite.

FIG. 26A is a digital photographic image of the resulting prismatic article in ambient light ($M_{25}$ is about 17 millimeters) in ambient light. FIG. 26B is taken at about a 45 degree tilt angle to show the specular reflection from the prismatic facets.

Example 18

Figure 27A:
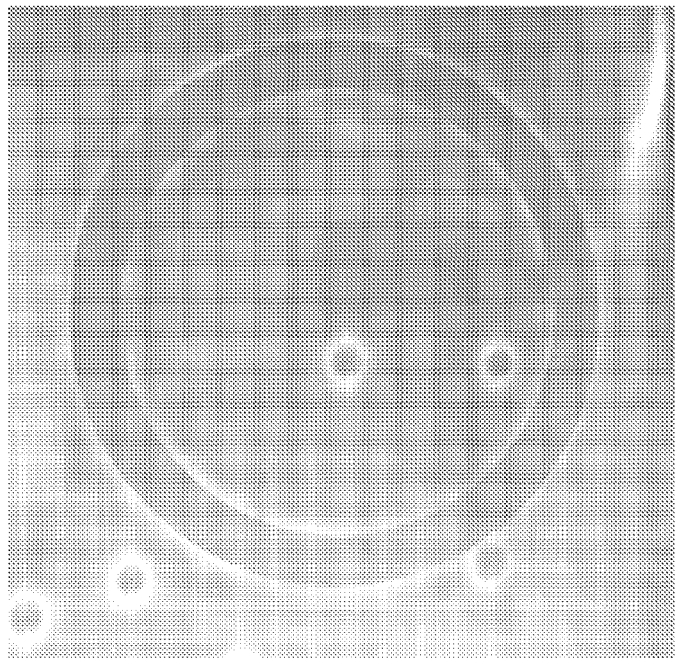
FIGS. 27A and 27B are digital photographic images of an exemplary differentially pattern cured microstructured article described herein.
Figure 27B:
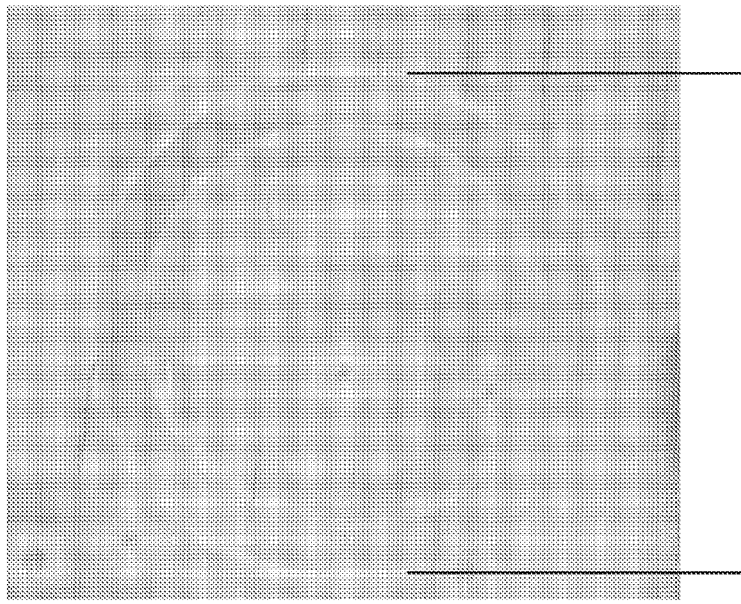

A retroreflective article was prepared using the following procedure. About 5 grams of Composition 7 were poured onto the upper microstructured face of a heated microstructured tool and then spread uniformly using a 250 micrometer PET film as a doctor blade. The tool was a nickel plate measuring about 25 cm by 30 cm and 760 micrometers in thickness. The tool had a microstructured surface consisting of cube corner cavities measuring 43 micrometers in depth with a pitch of 86 micrometers. The tool rested on a magnetic hotplate set at 60° C. After filling cavities of the tool with Composition 7 using the doctor blade, an overlay film was laminated to the upper face of the coated tool using an ink roller. The overlay film was a clear 75 micrometer primed PET film (obtained from DuPont Teijin Films under the trade designation "DUPONT-TEIJIN #617"). In a first curing step, the assembly consisting of the coated tool and the PET film was removed from the magnetic hotplate and was positioned vertically about 58 cm from the lens of a Davis Powerbeam "V" Digital Light Projector (DLP). A black and white image was projected through the film onto the resin coated on the tool for 45 seconds. The assembly was then placed on a conveyor belt and passed under an ultraviolet (UV) lamp to cure the coated composition. In a second curing step, a Fusion "H" UV lamp (Fusion Systems) set at 600 watt/2.5 cm (100% power setting) was used to irradiate the coated composition. The lamp was positioned 5 cm from the glass plate. The conveyor belt operated at 10.7 meters/min. FIGS. 27A and 27B are digital photographic images of the resulting retroreflective article, under ambient and retroreflected lighting conditions, respectively ($M_{26}$ is about 111 millimeters).

Example 19

Figure 28:
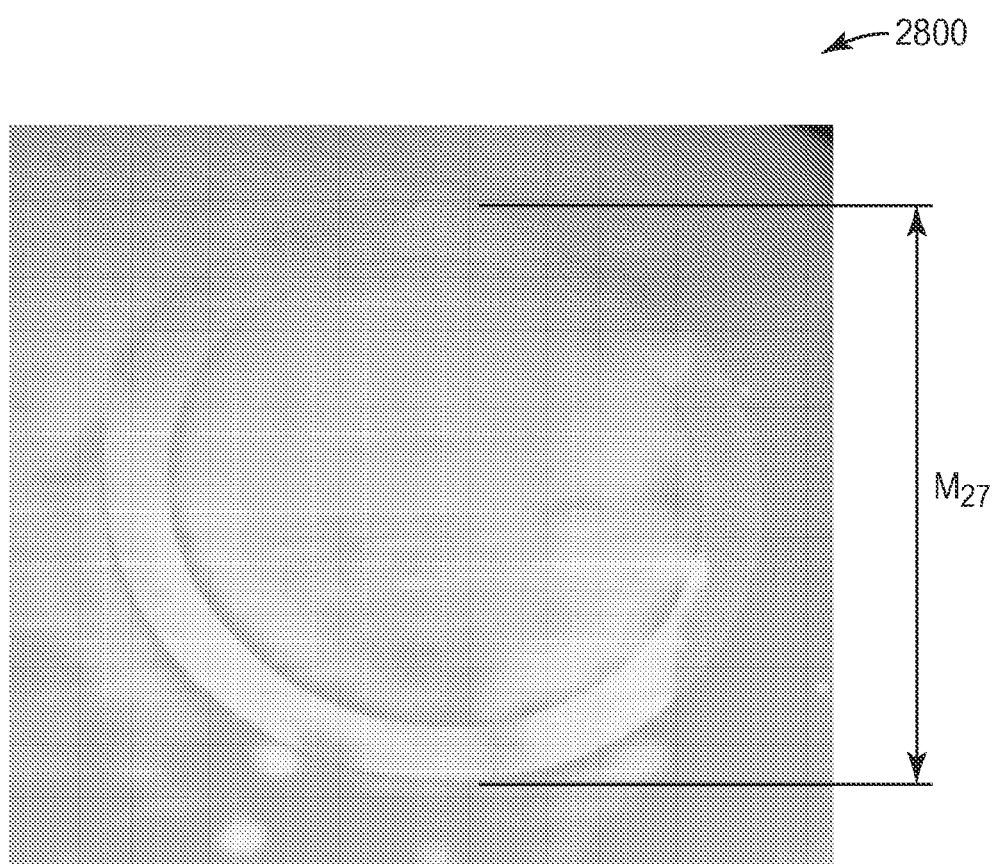
FIG. 28 is a digital photographic image of an exemplary differentially pattern cured microstructured article described herein.

A prismatic article was prepared identically to Example 18, except that the tool was a nickel plate measuring about 25 cm by 30 cm and 760 micrometers in thickness, and had a microstructured surface consisting of 90° prismatic grooves measuring 25 micrometers in depth with a pitch of 65 micrometers. FIG. 28 is a digital photographic image of the resulting retroreflective article 2800 ($M_{27}$ is about 111 millimeters).

Foreseeable modifications and alterations of this disclosure will be apparent to those skilled in the art without departing from the scope and spirit of this invention. This invention should not be restricted to the embodiments that are set forth in this application for illustrative purposes.

What is claimed is:

1. A method of making a composite, the method comprising:
    providing a molding tool having a microstructured surface including a plurality of cavities;
    at least partially filling the plurality of cavities with a first radiation curable resin;
    exposing the first radiation curable resin to a first, patterned irradiation to provide a correspondingly patterned partially cured resin comprising at least one first region and at least one second region, wherein the at least one first region is irradiated by the first, patterned irradiation such that the at least one first region of the first radiation curable resin is at least partially cured, and the at least one second region is not irradiated by the first, patterned irradiation such that the at least one second region of the first radiation curable resin is not cured;
    exposing both the at least one first region and the at least one second region of the partially cured resin to a second irradiation to form a further cured composite having a microstructured surface and a differentially cured pattern therein; and
    separating the further cured composite from the molding tool;
    wherein the first, patterned irradiation comprises at least one of irradiating through transparent regions of a mask, guiding a beam of light, guiding a beam of electrons, or projecting a digital image.

2. The method of claim 1, further comprising providing an overlay element to contact to the first radiation curable resin.

3. The method of claim 2, wherein the overlay element comprises a material selected from the group consisting of polymeric film, paper, fabric, fiberglass, nonwovens, glass, and metal foil.

4. The method of claim 2, wherein the overlay element is transparent to the first, patterned radiation.

5. The method of claim 1, wherein the molding tool is transparent to the radiation used in at least one of the irradiations.

6. The method of claim 1, further comprising applying a second radiation curable resin over the partially cured resin.

7. The method of claim 6, wherein the first and second radiation curable resins each have an index of refraction, and wherein the index of refraction of the first and second radiation curable resins have an absolute difference of less than 0.0002.

8. The method of claim 6, wherein the first and second radiation curable resins each have an index of refraction, and wherein the index of refraction of the first and second radiation curable resins have an absolute difference of at least 0.0002.

9. The method of claim 1, wherein there is a plurality of first regions within a matrix of the at least one second region.

10. The method of claim 1, wherein there is a plurality of second regions within a matrix of the at least one first region.

11. A method of making a composite article, the method comprising:
    providing a first molding tool having a first microstructured surface including a plurality of cavities;
    at least partially filling the plurality of cavities with a radiation curable resin disposed on a first major surface of an overlay element;
    exposing the radiation curable resin to a first, patterned irradiation to provide a partially cured composite comprising the overlay element adhered to a correspondingly patterned partially cured resin comprising at least one first region and at least one second region, wherein the at least one first region is irradiated by the first, patterned irradiation and the at least one second region is not irradiated by the first, patterned irradiation;

separating the partially cured composite from the molding tool, such that at least a portion of curable resin from the at least one second region remains in the molding tool, providing the separated partially cured composite with a surface that lacks microstructure in the at least one second region; and exposing the partially cured composite that was separated from the molding tool to a second irradiation, to provide a composite article having a first microstructured surface and a differentially cured pattern therein;

wherein the patterned irradiation comprises at least one of irradiating through transparent regions of a mask, guiding a beam of light, guiding a beam of electrons, or projecting a digital image;

wherein the overlay element comprises a material selected from the group consisting of polymeric film, paper, fabric, fiberglass, nonwovens, glass, and metal foil.

12. The method of claim 11, further comprising providing a second molding tool having a second microstructured surface including a second plurality of cavities;

at least partially filling the second plurality of cavities with a second radiation curable resin disposed on a second major surface of the overlay element of the composite article having a first microstructured surface and a differentially cured pattern therein;

exposing the second radiation curable resin to a third irradiation, to provide an article having the first microstructured surface and the differentially cured pattern therein on the first major surface and a second microstructured surface on the second major surface; and separating the article from the second molding tool.

13. The method of claim 11, wherein the overlay element is transparent to the radiation used in at least one of the irradiations.

14. The method of claim 11, wherein the first molding tool is transparent to the patterned irradiation.

15. The method of claim 14, wherein the overlay element is opaque to the patterned irradiation.

16. The method of claim 11, further comprising adding a pigment to at least a portion of the at least one second region prior to exposing the partially cured composite that was separated from the molding tool to a second irradiation.

17. A method of making a composite article, the method comprising:

providing a molding tool having a microstructured surface including a plurality of cavities;

at least partially filling the plurality of cavities with a radiation curable resin disposed on a major surface of an overlay element;

exposing the radiation curable resin to a patterned irradiation to provide a partially cured composite comprising the overlay element adhered to a correspondingly patterned partially cured resin comprising at least one first region and at least one second region, wherein the at least one first region is irradiated by the patterned irradiation and the at least one second region is not irradiated by the patterned irradiation;

separating the partially cured composite from the molding tool; and removing the radiation curable resin from the at least one second region to provide a composite article having a microstructured surface;

wherein the patterned irradiation comprises at least one of irradiating through transparent regions of a mask, guiding a beam of light, guiding a beam of electrons, or projecting a digital image;

wherein the overlay element comprises a material selected from the group consisting of polymeric film, paper, fabric, fiberglass, nonwovens, glass, and metal foil.

18. The method of claim 17, wherein the overlay element is transparent to the patterned irradiation.

19. The method of claim 17, wherein the molding tool is transparent to the patterned irradiation.

20. The method of claim 19, wherein the overlay element is opaque to the patterned irradiation.

* * * * *